(12) United States Patent
Carey et al.

(10) Patent No.: US 10,505,054 B2
(45) Date of Patent: Dec. 10, 2019

(54) HIGH SPEED PHOTOSENSITIVE DEVICES AND ASSOCIATED METHODS

(71) Applicant: SiOnyx, LLC, Beverly, MA (US)

(72) Inventors: James E. Carey, Ann Arbor, MI (US); Drake Miller, Tigard, OR (US)

(73) Assignee: SiOnyx, LLC, Beverly, MA (US)

( * ) Notice: Subject to any disclaimer, the term of this patent is extended or adjusted under 35 U.S.C. 154(b) by 0 days.

(21) Appl. No.: 15/679,827

(22) Filed: Aug. 17, 2017

(65) Prior Publication Data

US 2017/0345951 A1 Nov. 30, 2017

Related U.S. Application Data

(63) Continuation of application No. 14/580,143, filed on Dec. 14, 2014, now Pat. No. 9,761,739, which is a
(Continued)

(51) Int. Cl.
*H01L 31/02* (2006.01)
*H01L 31/028* (2006.01)
(Continued)

(52) U.S. Cl.
CPC .... *H01L 31/02024* (2013.01); *H01L 27/1446* (2013.01); *H01L 27/14629* (2013.01);
(Continued)

(58) Field of Classification Search
None
See application file for complete search history.

(56) References Cited

U.S. PATENT DOCUMENTS

| 3,487,223 A | 12/1969 | St. John |
| 3,922,571 A | 11/1975 | Smith |
| (Continued) | | |

FOREIGN PATENT DOCUMENTS

| AU | 3666484 | 6/1985 |
| CN | 1507075 | 6/2004 |
| (Continued) | | |

OTHER PUBLICATIONS

A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.
(Continued)

*Primary Examiner* — Wael M Fahmy
*Assistant Examiner* — Sarah Salerno
(74) *Attorney, Agent, or Firm* — Nelson Mullins Riley & Scarborough LLP; Thomas J. Engellenner; Reza Mollaaghababa

(57) ABSTRACT

High speed optoelectronic devices and associated methods are provided. In one aspect, for example, a high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm.

12 Claims, 8 Drawing Sheets

Related U.S. Application Data continuation of application No. 13/164,630, filed on Jun. 20, 2011.

(60) Provisional application No. 61/356,536, filed on Jun. 18, 2010.

(51) Int. Cl.
*H01L 27/144* (2006.01)
*H01L 27/146* (2006.01)
*H01L 31/0236* (2006.01)
*H01L 31/103* (2006.01)

(52) U.S. Cl.
CPC ...... *H01L 27/14643* (2013.01); *H01L 31/028* (2013.01); *H01L 31/02363* (2013.01); *H01L 31/103* (2013.01); *Y02E 10/50* (2013.01)

(56) References Cited

U.S. PATENT DOCUMENTS

| | | |
|---|---|---|
| 3,973,994 A | 8/1976 | Redfield |
| 3,994,012 A | 11/1976 | Warner, Jr. |
| 4,017,887 A | 4/1977 | Davies et al. |
| 4,105,955 A | 8/1978 | Hayashi |
| 4,149,174 A | 4/1979 | Shannon |
| 4,176,365 A | 11/1979 | Kroger |
| 4,181,538 A | 1/1980 | Narayan et al. |
| 4,201,450 A | 5/1980 | Trapani |
| 4,242,149 A | 12/1980 | King et al. |
| 4,253,882 A | 3/1981 | Dalal |
| 4,277,793 A | 7/1981 | Webb |
| 4,322,571 A | 3/1982 | Stanbery |
| 4,343,832 A | 8/1982 | Smith |
| 4,346,164 A | 8/1982 | Tabarelli et al. |
| 4,419,533 A | 12/1983 | Czubatyj et al. |
| 4,452,826 A | 6/1984 | Shields et al. |
| 4,493,942 A | 1/1985 | Sheng et al. |
| 4,514,582 A | 4/1985 | Tiedje et al. |
| 4,536,608 A | 8/1985 | Sheng et al. |
| 4,546,945 A | 10/1985 | Nessfield |
| 4,568,960 A | 2/1986 | Petroff et al. |
| 4,593,303 A | 6/1986 | Dyck et al. |
| 4,593,313 A | 6/1986 | Nagasaki et al. |
| 4,617,593 A | 10/1986 | Dudley |
| 4,630,082 A | 12/1986 | Sakai |
| 4,648,936 A | 3/1987 | Ashby et al. |
| 4,663,188 A | 5/1987 | Kane |
| 4,672,206 A | 6/1987 | Suzuki |
| 4,673,770 A | 6/1987 | Mandelkorn |
| 4,679,068 A | 7/1987 | Lillquist et al. |
| 4,703,996 A | 11/1987 | Glass et al. |
| 4,723,086 A | 2/1988 | Leibovich et al. |
| 4,751,571 A | 6/1988 | Lillquist |
| 4,773,944 A | 9/1988 | Nath et al. |
| 4,775,425 A | 10/1988 | Guha et al. |
| 4,777,490 A | 10/1988 | Sharma et al. |
| 4,829,013 A | 5/1989 | Yamazaki |
| 4,838,952 A | 6/1989 | Dill et al. |
| 4,883,962 A | 11/1989 | Elliott |
| 4,886,958 A | 12/1989 | Merryman |
| 4,887,255 A | 12/1989 | Handa et al. |
| 4,894,526 A | 1/1990 | Bethea et al. |
| 4,910,568 A | 3/1990 | Takei et al. |
| 4,910,588 A | 3/1990 | Kinoshita et al. |
| 4,964,134 A | 10/1990 | Westbrook et al. |
| 4,965,784 A | 10/1990 | Land et al. |
| 4,968,372 A | 11/1990 | Maass |
| 4,999,308 A | 3/1991 | Nishiura et al. |
| 5,021,100 A | 6/1991 | Ishihara et al. |
| 5,021,854 A | 6/1991 | Huth |
| 5,080,725 A | 1/1992 | Green et al. |
| 5,081,049 A | 1/1992 | Green et al. |
| 5,089,437 A | 2/1992 | Shima et al. |
| 5,100,478 A | 3/1992 | Kawabata |
| 5,101,260 A | 3/1992 | Nath |
| 5,114,876 A | 5/1992 | Weiner |
| 5,127,964 A | 7/1992 | Hamakawa et al. |
| 5,164,324 A | 11/1992 | Russell et al. |
| 5,182,231 A | 1/1993 | Hongo et al. |
| 5,208,822 A | 5/1993 | Haus et al. |
| 5,223,043 A | 6/1993 | Olson et al. |
| 5,234,790 A | 8/1993 | Lang et al. |
| 5,244,817 A | 9/1993 | Hawkins et al. |
| 5,296,045 A | 3/1994 | Banerjee et al. |
| 5,309,275 A | 5/1994 | Nishimura et al. |
| 5,322,988 A | 6/1994 | Russell et al. |
| 5,346,850 A | 9/1994 | Kaschmitter et al. |
| 5,351,446 A | 10/1994 | Langsdorf |
| 5,370,747 A | 12/1994 | Noguchi et al. |
| 5,373,182 A | 12/1994 | Norton |
| 5,381,431 A | 1/1995 | Zayhowski |
| 5,383,217 A | 1/1995 | Uemura |
| 5,390,201 A | 2/1995 | Tomono et al. |
| 5,410,168 A | 4/1995 | Hisa |
| 5,413,100 A | 5/1995 | Barthelemy et al. |
| 5,449,626 A | 9/1995 | Hezel |
| 5,454,347 A | 10/1995 | Shibata et al. |
| 5,502,329 A | 3/1996 | Pezzani |
| 5,507,881 A | 4/1996 | Sichanugrist et al. |
| 5,523,570 A | 6/1996 | Hairston |
| 5,559,361 A | 9/1996 | Pezzani |
| 5,569,615 A | 10/1996 | Yamazaki et al. |
| 5,569,624 A | 10/1996 | Weiner |
| 5,578,858 A | 11/1996 | Mueller et al. |
| 5,580,615 A | 12/1996 | Itoh et al. |
| 5,583,704 A | 12/1996 | Fujii |
| 5,589,008 A | 12/1996 | Kepper |
| 5,589,704 A | 12/1996 | Levine |
| 5,597,621 A | 1/1997 | Hummel et al. |
| 5,600,130 A | 2/1997 | VanZeghbroeck |
| 5,626,687 A | 5/1997 | Campbell |
| 5,627,081 A | 5/1997 | Tsuo et al. |
| 5,635,089 A | 6/1997 | Singh et al. |
| 5,640,013 A | 6/1997 | Ishikawa et al. |
| 5,641,362 A | 6/1997 | Meier |
| 5,641,969 A | 6/1997 | Cooke et al. |
| 5,705,413 A | 1/1998 | Harkin et al. |
| 5,705,828 A | 1/1998 | Noguchi et al. |
| 5,708,486 A | 1/1998 | Miyawaki et al. |
| 5,710,442 A | 1/1998 | Watanabe et al. |
| 5,714,404 A | 2/1998 | Mitlitsky et al. |
| 5,727,096 A | 3/1998 | Ghirardi et al. |
| 5,731,213 A | 3/1998 | Ono |
| 5,751,005 A | 5/1998 | Wyles et al. |
| 5,758,644 A | 6/1998 | Diab et al. |
| 5,766,127 A | 6/1998 | Pologe et al. |
| 5,766,964 A | 6/1998 | Rohatgi et al. |
| 5,773,820 A | 6/1998 | Osajda et al. |
| 5,779,631 A | 7/1998 | Chance |
| 5,781,392 A | 7/1998 | Clark |
| 5,792,280 A | 8/1998 | Ruby et al. |
| 5,802,091 A | 9/1998 | Chakrabarti et al. |
| 5,808,350 A | 9/1998 | Jack et al. |
| 5,859,446 A | 1/1999 | Nagasu et al. |
| 5,861,639 A | 1/1999 | Bernier |
| 5,871,826 A | 2/1999 | Mei |
| 5,898,672 A | 4/1999 | Ginzboorg |
| 5,918,140 A | 6/1999 | Wickboldt et al. |
| 5,923,071 A | 7/1999 | Saito |
| 5,935,320 A | 8/1999 | Graf et al. |
| 5,942,789 A | 8/1999 | Morikawa |
| 5,943,584 A | 8/1999 | Shim et al. |
| 5,963,790 A | 10/1999 | Matsuno et al. |
| 5,977,515 A | 11/1999 | Uraki et al. |
| 5,977,603 A | 11/1999 | Ishikawa |
| 5,995,606 A | 11/1999 | Civanlar et al. |
| 6,019,796 A | 2/2000 | Mei |
| 6,048,588 A | 4/2000 | Engelsberg |
| 6,049,058 A | 4/2000 | Dulaney et al. |
| 6,071,796 A | 6/2000 | Voutsas |
| 6,072,117 A | 6/2000 | Matsuyama et al. |
| 6,080,988 A | 6/2000 | Ishizuya et al. |
| 6,082,858 A | 7/2000 | Grace et al. |

(56) References Cited

U.S. PATENT DOCUMENTS

| | | |
|---|---|---|
| 6,097,031 A | 8/2000 | Cole |
| 6,106,689 A | 8/2000 | Matsuyama |
| 6,107,618 A | 8/2000 | Fossum et al. |
| 6,111,300 A | 8/2000 | Cao et al. |
| 6,117,499 A | 9/2000 | Wong et al. |
| 6,121,130 A | 9/2000 | Chua et al. |
| 6,128,379 A | 10/2000 | Smyk |
| 6,131,511 A | 10/2000 | Wachi et al. |
| 6,131,512 A | 10/2000 | Verlinden et al. |
| 6,147,297 A | 11/2000 | Wettling et al. |
| 6,160,833 A | 12/2000 | Floyd et al. |
| 6,168,965 B1 | 1/2001 | Malinovich et al. |
| 6,194,722 B1 | 2/2001 | Fiorini et al. |
| 6,204,506 B1 | 3/2001 | Akahori et al. |
| 6,229,192 B1 | 5/2001 | Gu |
| 6,242,291 B1 | 6/2001 | Kusumoto et al. |
| 6,252,256 B1 | 6/2001 | Ugge et al. |
| 6,272,768 B1 | 8/2001 | Danese |
| 6,290,713 B1 | 9/2001 | Russell |
| 6,291,302 B1 | 9/2001 | Yu |
| 6,313,901 B1 | 11/2001 | Cacharelis |
| 6,320,296 B1 | 11/2001 | Fujii et al. |
| 6,327,022 B1 | 12/2001 | Nishi |
| 6,331,445 B1 | 12/2001 | Janz et al. |
| 6,331,885 B1 | 12/2001 | Nishi |
| 6,333,485 B1 | 12/2001 | Haight et al. |
| 6,340,281 B1 | 1/2002 | Haraguchi |
| 6,372,536 B1 | 4/2002 | Fischer et al. |
| 6,372,591 B1 | 4/2002 | Mineji et al. |
| 6,372,611 B1 | 4/2002 | Horikawa |
| 6,379,979 B1 | 4/2002 | Connolly |
| 6,420,706 B1 | 7/2002 | Lurie et al. |
| 6,429,036 B1 | 8/2002 | Nixon et al. |
| 6,429,037 B1 | 8/2002 | Wenham et al. |
| 6,457,478 B1 | 10/2002 | Danese |
| 6,465,860 B2 | 10/2002 | Shigenaka et al. |
| 6,475,839 B2 | 11/2002 | Zhang et al. |
| 6,479,093 B2 | 11/2002 | Lauffer et al. |
| 6,483,116 B1 | 11/2002 | Kozlowski et al. |
| 6,483,929 B1 | 11/2002 | Murakami et al. |
| 6,486,046 B2 | 11/2002 | Fujimura et al. |
| 6,486,522 B1 | 11/2002 | Bishay et al. |
| 6,493,567 B1 | 12/2002 | Krivitski et al. |
| 6,498,336 B1 | 12/2002 | Tian et al. |
| 6,500,690 B1 | 12/2002 | Yamagishi et al. |
| 6,504,178 B2 | 1/2003 | Carlson et al. |
| 6,562,705 B1 | 5/2003 | Ohara |
| 6,580,053 B1 | 6/2003 | Voutsas |
| 6,583,936 B1 | 6/2003 | Kaminsky et al. |
| 6,586,318 B1 | 7/2003 | Lu |
| 6,597,025 B2 | 7/2003 | Lauter et al. |
| 6,607,927 B2 | 8/2003 | Ramappa et al. |
| 6,624,049 B1 | 9/2003 | Yamazaki |
| 6,639,253 B2 | 10/2003 | Duane et al. |
| 6,653,554 B2 | 11/2003 | Ishihara |
| 6,667,528 B2 | 12/2003 | Cohen et al. |
| 6,677,655 B2 | 1/2004 | Fitzergald |
| 6,677,656 B2 | 1/2004 | Francois |
| 6,683,326 B2 | 1/2004 | Iguchi et al. |
| 6,689,209 B2 | 2/2004 | Falster et al. |
| 6,690,968 B2 | 2/2004 | Mejia |
| 6,734,455 B2 | 5/2004 | Li |
| 6,753,585 B1 | 6/2004 | Kindt |
| 6,756,104 B2 | 6/2004 | Sokol et al. |
| 6,759,262 B2 | 7/2004 | Theil et al. |
| 6,790,701 B2 | 9/2004 | Shigenaka et al. |
| 6,796,144 B2 | 9/2004 | Shepard et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,876,003 B1 | 4/2005 | Nakamura et al. |
| 6,897,118 B1 | 5/2005 | Poon et al. |
| 6,900,839 B1 | 5/2005 | Kozlowski et al. |
| 6,907,135 B2 | 6/2005 | Gifford |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,112,545 B1 | 9/2006 | Railkar et al. |
| 7,126,212 B2 | 10/2006 | Enquist et al. |
| 7,132,724 B1 | 11/2006 | Merrill |
| 7,202,102 B2 | 4/2007 | Yao |
| 7,211,214 B2 | 5/2007 | Chou |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,315,014 B2 | 1/2008 | Lee et al. |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,413,909 B2 | 8/2008 | Hutchens et al. |
| 7,425,471 B2 | 9/2008 | Bruland et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 * | 3/2009 | Mazur ............... H01L 31/0236 257/463 |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |
| 7,560,750 B2 | 7/2009 | Niira et al. |
| 7,564,631 B2 | 7/2009 | Li et al. |
| 7,569,503 B2 | 8/2009 | Pan |
| 7,582,515 B2 | 9/2009 | Choi et al. |
| 7,586,601 B2 | 9/2009 | Eb stein |
| 7,592,593 B2 | 9/2009 | Kauffman et al. |
| 7,595,213 B2 | 9/2009 | Kwon et al. |
| 7,605,064 B2 | 10/2009 | Kizilyalli et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,234 B2 | 12/2009 | Bruland |
| 7,629,582 B2 | 12/2009 | Hoffman et al. |
| 7,648,851 B2 | 1/2010 | Fu et al. |
| 7,649,156 B2 | 1/2010 | Lee |
| 7,687,740 B2 | 3/2010 | Bruland et al. |
| 7,705,879 B2 | 4/2010 | Kerr et al. |
| 7,728,274 B2 | 6/2010 | Pilla et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |

(56) References Cited

U.S. PATENT DOCUMENTS

| | | |
|---|---|---|
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 | 11/2010 | Weber et al. |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 | 2/2011 | Mazur et al. |
| 7,897,942 B1 | 3/2011 | Bareket |
| 7,910,964 B2 | 3/2011 | Kawahito et al. |
| 7,923,801 B2 | 4/2011 | Tian et al. |
| 7,935,941 B2 | 5/2011 | Bruland et al. |
| 7,968,834 B2 | 6/2011 | Veeder |
| 8,008,205 B2 | 8/2011 | Fukushima et al. |
| 8,013,411 B2 | 9/2011 | Cole |
| 8,030,726 B2 | 10/2011 | Sumi |
| 8,035,343 B2 | 10/2011 | Seman, Jr. |
| 8,058,615 B2 | 11/2011 | McCaffrey |
| 8,076,746 B2 | 12/2011 | McCarten et al. |
| 8,080,467 B2 | 12/2011 | Carey et al. |
| 8,088,219 B2 | 1/2012 | Knerer et al. |
| 8,093,559 B1 | 1/2012 | Rajavel |
| RE43,169 E | 2/2012 | Parker |
| 8,164,126 B2 | 4/2012 | Moon et al. |
| 8,207,051 B2 | 6/2012 | Sickler et al. |
| 8,247,259 B2 | 8/2012 | Grolier et al. |
| 8,259,293 B2 | 9/2012 | Andreou et al. |
| 8,268,403 B2 | 9/2012 | Akiyama et al. |
| 8,288,702 B2 | 10/2012 | Veeder |
| 8,355,545 B2 | 1/2013 | Corcoran et al. |
| 8,445,950 B2 | 5/2013 | Iida et al. |
| 8,445,985 B2 | 5/2013 | Hiyama et al. |
| 8,456,546 B2 | 6/2013 | Oike |
| 8,470,619 B2 | 6/2013 | Bour |
| 8,476,681 B2 | 7/2013 | Haddad et al. |
| 8,530,264 B2 | 9/2013 | De Munck et al. |
| 8,564,087 B2 | 10/2013 | Yamamura et al. |
| 8,603,902 B2 | 12/2013 | Mazer et al. |
| 8,604,405 B2 | 12/2013 | Liu et al. |
| 8,629,485 B2 | 1/2014 | Yamamura et al. |
| 8,649,568 B2 | 2/2014 | Sato |
| 8,680,591 B2 | 3/2014 | Haddad et al. |
| 8,698,272 B2 | 4/2014 | Vineis |
| 8,729,678 B2 | 5/2014 | Shim et al. |
| 8,742,528 B2 | 6/2014 | Yamamura et al. |
| 8,884,226 B2 | 11/2014 | Miyazaki et al. |
| 8,906,670 B2 | 12/2014 | Gray |
| 8,916,945 B2 | 12/2014 | Sakamoto et al. |
| 8,928,784 B2 | 1/2015 | Watanabe et al. |
| 8,994,135 B2 | 3/2015 | Yamamura et al. |
| 9,064,762 B2 | 6/2015 | Yamaguchi |
| 9,184,204 B2 | 11/2015 | Hu |
| 9,190,551 B2 | 11/2015 | Yamamura et al. |
| 9,209,345 B2 | 12/2015 | Haddad |
| 9,276,143 B2 | 3/2016 | Mazur |
| 9,369,641 B2 | 6/2016 | Hu |
| 9,419,159 B2 | 8/2016 | Sakamoto et al. |
| 9,478,572 B2 | 10/2016 | Miyanami |
| 9,559,215 B1 | 1/2017 | Ahmed |
| 9,659,984 B2 | 5/2017 | Ohkubo et al. |
| 9,673,250 B2 | 6/2017 | Haddad |
| 2001/0017344 A1 | 8/2001 | Aebi |
| 2001/0022768 A1 | 9/2001 | Takahashi |
| 2001/0044175 A1 | 11/2001 | Barrett et al. |
| 2001/0044251 A1 | 11/2001 | Cho et al. |
| 2001/0044266 A1 | 11/2001 | Katsuoka |
| 2002/0020893 A1 | 2/2002 | Lhorte |
| 2002/0024618 A1 | 2/2002 | Imai |
| 2002/0034845 A1 | 3/2002 | Fujimura et al. |
| 2002/0056845 A1 | 5/2002 | Iguchi et al. |
| 2002/0060322 A1 | 5/2002 | Tanabe et al. |
| 2002/0079290 A1 | 6/2002 | Holdermann |
| 2002/0117699 A1 | 8/2002 | Francois |
| 2002/0126333 A1 | 9/2002 | Hosono et al. |
| 2002/0148964 A1 | 10/2002 | Dausch et al. |
| 2002/0176650 A1 | 11/2002 | Zhao et al. |
| 2002/0182769 A1 | 12/2002 | Campbell |
| 2003/0016708 A1 | 1/2003 | Albrecht et al. |
| 2003/0024269 A1 | 2/2003 | Shepard et al. |
| 2003/0025156 A1 | 2/2003 | Yamazaki et al. |
| 2003/0029495 A1 | 2/2003 | Mazur et al. |
| 2003/0030083 A1 | 2/2003 | Lee et al. |
| 2003/0045074 A1 | 3/2003 | Seibel et al. |
| 2003/0045092 A1 | 3/2003 | Shin |
| 2003/0057357 A1 | 3/2003 | Uppal et al. |
| 2003/0111106 A1 | 6/2003 | Nagano et al. |
| 2003/0132449 A1 | 7/2003 | Hosono et al. |
| 2003/0183270 A1 | 10/2003 | Falk et al. |
| 2003/0210332 A1 | 11/2003 | Frame |
| 2003/0213515 A1 | 11/2003 | Sano et al. |
| 2003/0214595 A1 | 11/2003 | Mabuchi |
| 2003/0228883 A1 | 12/2003 | Kusakari et al. |
| 2004/0014307 A1 | 1/2004 | Shin et al. |
| 2004/0016886 A1 | 1/2004 | Ringermacher et al. |
| 2004/0041168 A1 | 3/2004 | Hembree et al. |
| 2004/0046224 A1 | 3/2004 | Rossel et al. |
| 2004/0077117 A1 | 4/2004 | Ding et al. |
| 2004/0080638 A1 | 4/2004 | Lee |
| 2004/0112426 A1 | 6/2004 | Hagino |
| 2004/0130020 A1 | 7/2004 | Kuwabara et al. |
| 2004/0161868 A1 | 8/2004 | Hong |
| 2004/0169834 A1 | 9/2004 | Richter et al. |
| 2004/0222187 A1 | 11/2004 | Lin |
| 2004/0252931 A1 | 12/2004 | Belleville et al. |
| 2004/0256561 A1 | 12/2004 | Beuhler et al. |
| 2005/0032249 A1 | 2/2005 | Im et al. |
| 2005/0040440 A1 | 2/2005 | Murakami |
| 2005/0051822 A1 | 3/2005 | Manning |
| 2005/0062041 A1 | 3/2005 | Terakawa et al. |
| 2005/0063566 A1 | 3/2005 | Beek et al. |
| 2005/0088634 A1 | 4/2005 | Kosugi |
| 2005/0093100 A1 | 5/2005 | Chen et al. |
| 2005/0101100 A1 | 5/2005 | Kretchmer et al. |
| 2005/0101160 A1 | 5/2005 | Garg et al. |
| 2005/0127401 A1 | 6/2005 | Mazur et al. |
| 2005/0134698 A1 | 6/2005 | Schroeder et al. |
| 2005/0150542 A1 | 7/2005 | Madan |
| 2005/0158969 A1 | 7/2005 | Binns et al. |
| 2005/0184291 A1 | 8/2005 | Cole et al. |
| 2005/0184353 A1 | 8/2005 | Mouli |
| 2005/0211996 A1 | 9/2005 | Krishna et al. |
| 2005/0226287 A1 | 10/2005 | Shah et al. |
| 2005/0227390 A1 | 10/2005 | Shtein et al. |
| 2005/0227457 A1 | 10/2005 | Kondo et al. |
| 2006/0006482 A1 | 1/2006 | Rieve et al. |
| 2006/0011954 A1 | 1/2006 | Ueda et al. |
| 2006/0011955 A1 | 1/2006 | Baggenstoss |
| 2006/0060848 A1 | 3/2006 | Chang et al. |
| 2006/0071254 A1 | 4/2006 | Rhodes |
| 2006/0079062 A1 | 4/2006 | Mazur et al. |
| 2006/0086956 A1 | 4/2006 | Furukawa et al. |
| 2006/0097172 A1 | 5/2006 | Park |
| 2006/0097290 A1 | 5/2006 | Hietanen |
| 2006/0102901 A1 | 5/2006 | Im et al. |
| 2006/0118781 A1 | 6/2006 | Rhodes |
| 2006/0121680 A1 | 6/2006 | Tanaka |
| 2006/0128087 A1 | 6/2006 | Bamji et al. |
| 2006/0132633 A1 | 6/2006 | Nam et al. |
| 2006/0138396 A1 | 6/2006 | Lin et al. |
| 2006/0145148 A1 | 7/2006 | Hirai et al. |
| 2006/0145176 A1 | 7/2006 | Lee |
| 2006/0160343 A1 | 7/2006 | Chong et al. |
| 2006/0166475 A1 | 7/2006 | Mantl |
| 2006/0175529 A1 | 8/2006 | Harmon et al. |
| 2006/0180885 A1 | 8/2006 | Rhodes |
| 2006/0181627 A1 | 8/2006 | Farrier |
| 2006/0210122 A1 | 9/2006 | Cleveland |
| 2006/0214121 A1 | 9/2006 | Schrey et al. |
| 2006/0228897 A1 | 10/2006 | Timans |
| 2006/0231853 A1 | 10/2006 | Tanaka |
| 2006/0231914 A1 | 10/2006 | Carey et al. |

(56) References Cited

U.S. PATENT DOCUMENTS

| | | |
|---|---|---|
| 2006/0238632 A1 | 10/2006 | Shah |
| 2006/0244090 A1 | 11/2006 | Roy et al. |
| 2006/0255340 A1 | 11/2006 | Manivannan et al. |
| 2006/0257140 A1 | 11/2006 | Seger |
| 2007/0035849 A1 | 2/2007 | Li et al. |
| 2007/0035879 A1 | 2/2007 | Hall et al. |
| 2007/0051876 A1 | 3/2007 | Sumi et al. |
| 2007/0052050 A1 | 3/2007 | Dierickx |
| 2007/0063219 A1 | 3/2007 | Sa'ar et al. |
| 2007/0076481 A1 | 4/2007 | Tennant |
| 2007/0102709 A1 | 5/2007 | Burgener et al. |
| 2007/0103580 A1 | 5/2007 | Noto |
| 2007/0115554 A1 | 5/2007 | Breitung et al. |
| 2007/0123005 A1 | 5/2007 | Hiura et al. |
| 2007/0125951 A1 | 6/2007 | Snider et al. |
| 2007/0131275 A1 | 6/2007 | Kinsey et al. |
| 2007/0138590 A1 | 6/2007 | Wells et al. |
| 2007/0145505 A1 | 6/2007 | Kim et al. |
| 2007/0178672 A1 | 8/2007 | Tanaka et al. |
| 2007/0187670 A1 | 8/2007 | Hsu et al. |
| 2007/0189583 A1 | 8/2007 | Shimada et al. |
| 2007/0194356 A1 | 8/2007 | Moon et al. |
| 2007/0194401 A1 | 8/2007 | Nagai et al. |
| 2007/0195056 A1 | 8/2007 | Lloyd |
| 2007/0200940 A1 | 8/2007 | Gruhlke et al. |
| 2007/0201859 A1 | 8/2007 | Sarrat |
| 2007/0235827 A1 | 10/2007 | Altice |
| 2007/0237504 A1 | 10/2007 | Nakashiba |
| 2007/0243701 A1 | 10/2007 | Ito et al. |
| 2007/0247414 A1 | 10/2007 | Roberts |
| 2007/0262366 A1 | 11/2007 | Baek et al. |
| 2007/0290283 A1 | 12/2007 | Park et al. |
| 2007/0293056 A1 | 12/2007 | Setsuhara et al. |
| 2007/0296060 A1 | 12/2007 | Tanabe et al. |
| 2007/0298533 A1 | 12/2007 | Yang et al. |
| 2008/0002863 A1 | 1/2008 | Northcott |
| 2008/0020555 A1 | 1/2008 | Shimomura et al. |
| 2008/0026550 A1 | 1/2008 | Werner et al. |
| 2008/0036022 A1 | 2/2008 | Hwang et al. |
| 2008/0044943 A1 | 2/2008 | Mazur et al. |
| 2008/0076240 A1 | 3/2008 | Veschetti et al. |
| 2008/0099804 A1 | 5/2008 | Venezia |
| 2008/0121280 A1 | 5/2008 | Carnel et al. |
| 2008/0121805 A1 | 5/2008 | Tweet et al. |
| 2008/0135099 A1 | 6/2008 | Yu |
| 2008/0142686 A1 | 6/2008 | Konno et al. |
| 2008/0158398 A1 | 7/2008 | Yaffe et al. |
| 2008/0170173 A1 | 7/2008 | Park et al. |
| 2008/0173620 A1 | 7/2008 | Grek |
| 2008/0174685 A1 | 7/2008 | Shan et al. |
| 2008/0178932 A1 | 7/2008 | Den Boer et al. |
| 2008/0179762 A1 | 7/2008 | Cho et al. |
| 2008/0191296 A1 | 8/2008 | Wang et al. |
| 2008/0191310 A1 | 8/2008 | Wu et al. |
| 2008/0192132 A1 | 8/2008 | Bechtel et al. |
| 2008/0192133 A1 | 8/2008 | Abiru et al. |
| 2008/0196761 A1 | 8/2008 | Nakano et al. |
| 2008/0198251 A1 | 8/2008 | Xu et al. |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0251812 A1 | 10/2008 | Yoo |
| 2008/0257409 A1 | 10/2008 | Li et al. |
| 2008/0258604 A1 | 10/2008 | Mazur et al. |
| 2008/0266434 A1 | 10/2008 | Sugawa et al. |
| 2008/0266435 A1 | 10/2008 | Agranov et al. |
| 2008/0281174 A1 | 11/2008 | Dietiker |
| 2008/0284884 A1 | 11/2008 | Makino et al. |
| 2008/0303932 A1 | 12/2008 | Wang et al. |
| 2008/0309913 A1 | 12/2008 | Fallon |
| 2009/0002528 A1 | 1/2009 | Manabe et al. |
| 2009/0009596 A1 | 1/2009 | Kerr et al. |
| 2009/0014056 A1 | 1/2009 | Hockaday |
| 2009/0027640 A1 | 1/2009 | Shibazaki et al. |
| 2009/0036783 A1 | 2/2009 | Kishima |
| 2009/0038669 A1 | 2/2009 | Atanackovic |
| 2009/0039397 A1 | 2/2009 | Chao |
| 2009/0050944 A1 | 2/2009 | Hong |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0090988 A1 | 4/2009 | Ohgishi |
| 2009/0095887 A1 | 4/2009 | Saveliev |
| 2009/0096049 A1 | 4/2009 | Oshiyama et al. |
| 2009/0101197 A1 | 4/2009 | Morikawa |
| 2009/0109305 A1 | 4/2009 | Dai et al. |
| 2009/0114630 A1 | 5/2009 | Hawryluk |
| 2009/0142879 A1 | 6/2009 | Isaka et al. |
| 2009/0146240 A1 | 6/2009 | Carey, III et al. |
| 2009/0151785 A1 | 6/2009 | Namn et al. |
| 2009/0160983 A1 | 6/2009 | Lenchenkov |
| 2009/0174026 A1 | 7/2009 | Carey et al. |
| 2009/0179199 A1 | 7/2009 | Sano et al. |
| 2009/0180010 A1 | 7/2009 | Adkisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200625 A1 | 8/2009 | Venezia et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242019 A1 | 10/2009 | Ramamoorthy et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1 | 10/2009 | Tatani et al. |
| 2009/0261255 A1 | 10/2009 | Nakamura et al. |
| 2009/0273695 A1 | 11/2009 | Mabuchi |
| 2009/0278967 A1 | 11/2009 | Toumiya |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2009/0308457 A1 | 12/2009 | Smith et al. |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey |
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1 | 3/2010 | Gidon et al. |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |
| 2010/0102206 A1 | 4/2010 | Cazaux et al. |
| 2010/0102366 A1 | 4/2010 | Lee et al. |
| 2010/0108864 A1 | 5/2010 | Ohta et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |
| 2010/0128161 A1 | 5/2010 | Yamaguchi |
| 2010/0128937 A1 | 5/2010 | Yoo et al. |
| 2010/0133635 A1 | 6/2010 | Lee et al. |
| 2010/0140733 A1 | 6/2010 | Lee et al. |

(56) References Cited

U.S. PATENT DOCUMENTS

| | | |
|---|---|---|
| 2010/0140768 A1 | 6/2010 | Zafiropoulo |
| 2010/0143744 A1 | 6/2010 | Gupta |
| 2010/0147383 A1 | 6/2010 | Carey et al. |
| 2010/0171948 A1 | 7/2010 | Mazur et al. |
| 2010/0190292 A1 | 7/2010 | Alberts |
| 2010/0200658 A1 | 8/2010 | Olmstead et al. |
| 2010/0201834 A1 | 8/2010 | Maruyama et al. |
| 2010/0213582 A9 | 8/2010 | Couillard et al. |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0003424 A1 | 1/2011 | De Ceuster et al. |
| 2011/0019050 A1 | 1/2011 | Yamashita |
| 2011/0025842 A1 | 2/2011 | King et al. |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0104850 A1 | 5/2011 | Weidman et al. |
| 2011/0127567 A1 | 6/2011 | Seong |
| 2011/0140221 A1 | 6/2011 | Venezia et al. |
| 2011/0150304 A1 | 6/2011 | Abe et al. |
| 2011/0194100 A1 | 8/2011 | Thiel et al. |
| 2011/0220971 A1 | 9/2011 | Haddad |
| 2011/0227138 A1 | 9/2011 | Haddad |
| 2011/0241148 A1 | 10/2011 | Hiyama et al. |
| 2011/0241152 A1 | 10/2011 | Hsiao et al. |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0292380 A1 | 12/2011 | Bamji |
| 2011/0303999 A1 | 12/2011 | Sakamoto et al. |
| 2012/0001841 A1 | 1/2012 | Gokingco et al. |
| 2012/0024363 A1 | 2/2012 | Dimer et al. |
| 2012/0024364 A1 | 2/2012 | Carey, III et al. |
| 2012/0025199 A1 | 2/2012 | Chen et al. |
| 2012/0038811 A1 | 2/2012 | Ellis-monaghan et al. |
| 2012/0043637 A1 | 2/2012 | King et al. |
| 2012/0049242 A1 | 3/2012 | Atanackovic et al. |
| 2012/0049306 A1 | 3/2012 | Ohba et al. |
| 2012/0080733 A1 | 4/2012 | Doan et al. |
| 2012/0111396 A1 | 5/2012 | Saylor et al. |
| 2012/0147241 A1 | 6/2012 | Yamaguchi |
| 2012/0153127 A1 | 6/2012 | Hirigoyen et al. |
| 2012/0153128 A1 | 6/2012 | Roy et al. |
| 2012/0171804 A1 | 7/2012 | Moslehi et al. |
| 2012/0187190 A1 | 7/2012 | Wang et al. |
| 2012/0188431 A1 | 7/2012 | Takimoto |
| 2012/0217602 A1 | 8/2012 | Enomoto |
| 2012/0222396 A1 | 9/2012 | Clemen |
| 2012/0228473 A1 | 9/2012 | Yoshitsugu |
| 2012/0274744 A1 | 11/2012 | Wan |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | Mckee et al. |
| 2013/0001553 A1 | 1/2013 | Vineis et al. |
| 2013/0020468 A1 | 1/2013 | Mitsuhashi et al. |
| 2013/0026531 A1 | 1/2013 | Seo et al. |
| 2013/0082343 A1 | 4/2013 | Fudaba et al. |
| 2013/0135439 A1 | 5/2013 | Kakuko et al. |
| 2013/0168792 A1 | 7/2013 | Haddad et al. |
| 2013/0168803 A1 | 7/2013 | Haddad et al. |
| 2013/0200251 A1 | 8/2013 | Velichko |
| 2013/0207212 A1 | 8/2013 | Mao et al. |
| 2013/0207214 A1 | 8/2013 | Haddad et al. |
| 2013/0285130 A1 | 10/2013 | Ting |
| 2014/0054662 A1 | 2/2014 | Yanagita et al. |
| 2014/0198240 A1 | 7/2014 | Rhoads |
| 2014/0247378 A1 | 9/2014 | Sharma et al. |
| 2014/0352779 A1 | 12/2014 | Smirnov et al. |
| 2014/0374868 A1 | 12/2014 | Lee et al. |
| 2015/0076468 A1 | 3/2015 | Yamaguchi et al. |
| 2017/0141258 A1 | 5/2017 | McFarland |
| 2017/0244920 A1 | 8/2017 | Ohkubo et al. |

FOREIGN PATENT DOCUMENTS

| | | |
|---|---|---|
| CN | 1614789 | 5/2005 |
| CN | 101053065 A | 10/2007 |
| CN | 101241923 | 8/2008 |
| CN | 101404307 | 4/2009 |
| CN | 101423942 | 5/2009 |
| CN | 101465361 | 6/2009 |
| CN | 101478013 | 7/2009 |
| CN | 101634026 | 1/2010 |
| CN | 101634027 | 1/2010 |
| CN | 101740597 | 6/2010 |
| CN | 101818348 | 9/2010 |
| CN | 201725796 | 1/2011 |
| CN | 101978498 | 2/2011 |
| DE | 19838439 | 4/2000 |
| EP | 0473439 | 3/1992 |
| EP | 0566156 | 10/1993 |
| EP | 1347670 A1 | 9/2003 |
| EP | 1630871 | 1/2006 |
| EP | 1873840 | 1/2008 |
| EP | 2073270 | 5/2012 |
| EP | 2509107 | 10/2012 |
| FR | 2827707 | 1/2003 |
| GB | 2030766 | 4/1980 |
| JP | S5771188 | 5/1982 |
| JP | S57173966 | 10/1982 |
| JP | S63116421 | 5/1988 |
| JP | H02152226 | 6/1990 |
| JP | H02237026 | 9/1990 |
| JP | H03183037 | 8/1991 |
| JP | H04318970 | 11/1992 |
| JP | H06104414 | 4/1994 |
| JP | 1994244444 A | 9/1994 |
| JP | H06244444 | 9/1994 |
| JP | H06267868 | 9/1994 |
| JP | H06267868 A | 9/1994 |
| JP | H06275641 | 9/1994 |
| JP | H0774240 | 3/1995 |
| JP | H07235658 | 5/1995 |
| JP | H07183484 | 7/1995 |
| JP | 9148594 | 6/1997 |
| JP | H09298308 | 11/1997 |
| JP | 11077348 | 3/1999 |
| JP | 11097724 | 4/1999 |
| JP | 2000164914 | 6/2000 |
| JP | 2001007381 | 1/2001 |
| JP | 2001024936 | 1/2001 |
| JP | 2001189478 | 7/2001 |
| JP | 2001257927 | 9/2001 |
| JP | 2001339057 | 12/2001 |
| JP | 2002043594 | 2/2002 |
| JP | 2002134640 | 5/2002 |
| JP | 2002190386 | 7/2002 |
| JP | 2003058269 | 2/2003 |
| JP | 2003104121 | 4/2003 |
| JP | 2003163360 | 6/2003 |
| JP | 2003242125 | 8/2003 |
| JP | 2003258285 | 9/2003 |
| JP | 2003308130 | 10/2003 |
| JP | 2004047682 | 2/2004 |
| JP | 2004273886 | 9/2004 |
| JP | 2004273887 | 9/2004 |
| JP | 2005339425 | 12/2005 |
| JP | 2006033493 | 2/2006 |
| JP | 2006147991 | 6/2006 |
| JP | 2006173381 | 6/2006 |
| JP | 2006210701 | 8/2006 |

(56) References Cited

FOREIGN PATENT DOCUMENTS

| | | |
|---|---|---|
| JP | 2006255430 | 9/2006 |
| JP | 2006261372 | 9/2006 |
| JP | 2007122237 | 5/2007 |
| JP | 2007165909 | 6/2007 |
| JP | 2007180642 | 7/2007 |
| JP | 2007180643 | 7/2007 |
| JP | 2007258684 | 10/2007 |
| JP | 2007305675 | 11/2007 |
| JP | 2008099158 | 4/2008 |
| JP | 2008167004 | 7/2008 |
| JP | 2008187003 | 8/2008 |
| JP | 2008283219 | 11/2008 |
| JP | 2008294698 | 12/2008 |
| JP | 2009021479 | 1/2009 |
| JP | 2009152569 | 7/2009 |
| JP | 2009253683 | 10/2009 |
| JP | 2010278472 | 12/2010 |
| JP | 2011003860 | 1/2011 |
| JP | 2011091128 | 5/2011 |
| JP | 2012054321 | 3/2012 |
| JP | 2012169530 | 9/2012 |
| JP | 2012191005 | 10/2012 |
| JP | 2012212349 | 11/2012 |
| KR | 20010061058 | 4/2001 |
| KR | 2005039273 | 4/2005 |
| KR | 20060020400 | 3/2006 |
| KR | 20080014301 | 2/2008 |
| KR | 100825808 | 4/2008 |
| KR | 20080097709 | 11/2008 |
| KR | 20090077274 | 7/2009 |
| KR | 20100026463 | 3/2010 |
| KR | 20100118864 | 11/2010 |
| KR | 20110079323 | 7/2011 |
| KR | 20060052278 | 5/2016 |
| KR | 20170070266 | 6/2017 |
| NA | 102270646 | 12/2011 |
| TW | 200627675 | 8/2006 |
| TW | 200818529 | 4/2008 |
| WO | WO 91/14284 | 9/1991 |
| WO | WO 2000031679 | 6/2000 |
| WO | WO 0131842 | 3/2001 |
| WO | WO 0135601 | 5/2001 |
| WO | WO 2002041363 | 5/2002 |
| WO | WO 03/059390 | 7/2003 |
| WO | WO 2005029599 | 3/2005 |
| WO | WO 2006043690 | 4/2006 |
| WO | WO 2006054758 | 5/2006 |
| WO | WO 2006/086014 | 8/2006 |
| WO | WO 2008091242 | 7/2008 |
| WO | WO 2008099524 | 8/2008 |
| WO | WO 2008145097 | 12/2008 |
| WO | WO 2009016846 | 2/2009 |
| WO | WO 2009100023 | 8/2009 |
| WO | WO 2009147085 | 12/2009 |
| WO | WO 2010033127 | 3/2010 |
| WO | WO 2011003871 | 1/2011 |
| WO | WO 2011035188 | 3/2011 |
| WO | WO 2011119618 | 3/2011 |
| WO | WO 2012027290 | 3/2012 |
| WO | WO 2012117931 | 9/2012 |
| WO | WO 2012174752 | 12/2012 |
| WO | WO 2014110484 | 7/2014 |

OTHER PUBLICATIONS

Asom et al., Interstitial Defect Reactions in Silicon; Appl. Phys. Lett.; Jul. 27, 1987; pp. 256-258; vol. 51(4); American Institute of Physics.

Berger, Michael; Moth Eyes Inspire Self-Cleaning Antireflection Nanotechnology Coatings; 2008; 3 pages; Nanowerk LLC.

Berger, O., Inns, D. and Aberle, A.E. "Commercial White Paint as Back Surface Reflector for Thin-Film Solar Cells", Solar Energy Materials & Solar Cells, vol. 91, pp. 1215-1221,2007.

Betta et al.; Si-PIN X-Ray Detector Technology; Nuclear Instruments and Methods in Physics Research; 1997; pp. 344-348; vol. A, No. 395; Elsevier Science B.V.

Boden, S.A. et al.; Nanoimprinting for Antireflective Moth-Eye Surfaces; 4 pages; 2008.

Bogue: "From bolometers to beetles: the development of the thermal imaging sensors;" sensor Review; 2007; pp. 278-281; Emerald Group Publishing Limited (ISSN 0260-2288).

Borghesi et al.; "Oxygen Precipitation in Silicon," J. Appl. Phys., v. 77(9), pp. 4169-4244 (May 1, 1995).

Born, M. and E.Wolf, "Princip les of Optics, 7th Ed.", Cambridge University Press, 1999, pp. 246-255.

Brieger,S., O.Dubbers, S.Fricker, A.Manzke, C.Pfahler, A.Plettl, and P.Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.

Buttgen, B.; "Demodulation Pixel Based on Static Drift Fields"; IEEE Transactions on Electron Devices, vol. 53, No. 11, Nov. 2006.

Carey, P.G. et al., "In-situ Doping of Silicon Using Gas Immersion Laser Doping (GILD) Process," Appl. Surf. Sci. 43, 325-332 (1989).

Carey et al., "Femtosecond-Laser-Assisted Microstructuring of Silicon Surfaces", Optics and Photonics News, 2003. 14, 32-36.

Carey, et al. "Femtosecond Laser-Assisted Microstructuring of Silicon for Novel Detector, Sensing and Display Technologies", LEOS 2003, 481-482, Tuscon, AR.

Carey, et al. "Femtosecond Laser-Assisted Microstructuring of Silicon for Novel Detector, Sensing and Display Technologies", LEOS; 2002, 97-98, Glasgos, Scotland, 2002.

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al., "High Sensitivity Silicon-Based VIS/NIR Photodetectors", Optical Society of America (2003) 1-2.

Carey, III; "Femtosecond-laser Microstructuring of Silicon for Novel Optoelectronic Devices"; Harvard University, Jul. 2004; (Thesis).

Chang, S.W., V.P.Chuang, S.T.Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.

Chen, Q. et al.; Broadband moth-eye antireflection coatings fabricated by low-cost nanoimprinting; Applied Physics Letters 94; pp. 263118-1-263118-3; 2009; American Institute of Physics.

Chien et al, "Pulse Width Effect in Ultrafast Laser Processing of Materials," Applied Physics A, 2005, 1257-1263, 81, Springer Berlin, Heidelberg, Germany.

Chiang, Wen Jen Et al., "Silicon Nanocrystal-Based Photosensor on Low-Temperature Polycrystalline-Silicone Panels", Applied Physics Letters, 2007, 51120-1-51120-3, Ltt. 91, American Inst. Of Physics, Melville, NY.

Chichkov, B.N. et al, "Femtosecond, picosecond and nanosecond laser ablation of solids" Appl. Phys. A 63, 109-115; 1996.

Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.

Cmosis; "Global Shutter Image Sensors for Machine Vision Application"; Image Sensors Europe 2010, Mar. 23-25, 2010; .COPYRGT. copyright 2010.

Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.

Crouch et al., "Comparison of Structure and Properties of Femtosecond and Nanosecond Laser-Structured Silicon" Appl. Phys. Lett., 2004, 84, 1850-1852.

Crouch et al., "Infrared Absorption by Sulfur-Doped Silicon Formed by Femtosecond Laser Irradiation", Appl. Phys. A, 2004, 79, 1635-1641.

(56) References Cited

OTHER PUBLICATIONS

Despeisse, et al.; "Thin Film Silicon Solar Cell on Highly Textured Substrates for High Conversion Efficiency"; 2004.
Detection of X-ray and Gamma-ray Photons Using Silicon Diodes; Dec. 2000; Detection Technology, Inc.; Micropolis, Finland.
Dewan, Rahul et al.; Light Trapping in Thin-Film Silicon Solar Cells with Submicron Surface Texture; Optics Express; vol. 17, No. 25; Dec. 7, 2009; Optical Society of America.
Deych et al.; Advances in Computed Tomography and Digital Mammography; Power Point; Nov. 18, 2008; Analogic Corp.; Peabody, MA.
Dobie, et al.; "Minimization of reflected light in photovoltaic modules"; Mar. 1, 2009.
Dobrzanski, L.A. et al.; Laser Surface Treatment of Multicrystalline Silicon for Enhancing Optical Properties; Journal of Materials Processing Technology; p. 291-296; 2007; Elsevier B.V.
Dolgaev et al., "Formation of Conical Microstructures Upon Laser Evaporation of Solids", Appl. Phys. A, 2001, 73, 177-181.
Duerinckx, et al.; "Optical Path Length Enhancement for >13% Screenprinted Thin Film Silicon Solar Cells"; 2006.
Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.
Forbes; "Texturing, reflectivity, diffuse scattering and light trapping in silicon solar cells"; 2012.
Forbes, L. and M.Y. Louie, "Backside Nanoscale Texturing to Improve IR Response of Silicon Photodetectors and Solar Cells," Nanotech, vol. 2, pp. 9-12, Jun. 2010.
Fowlkes et al., "Surface Microstructuring and Long-Range Ordering of Silicon Nanoparticles", Appl. Phys. Lett., 2002, 80 (20), 3799-3801.
Gibbons, J., "Ion Implantation in Semiconductors-Part II; Damage Production and Annealing", proceedings of the IEEE vol. 60, No. 9 pp. 1062-1096. Jun. 1972.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Gjessing, J. et al.; 2D blazed grating for light trapping in thin silicon solar cells; 3 pages; 2010; Optical Society of America.
Gloeckler et al. Band-Gap Grading in CU(In,Ga)Se2 Solar Cells, Journal of Physics and Chemistry of Solids; 2005; pp. 189-194; vol. 66.
Goetzberger, et al.; "Solar Energy Materials & Solar Cells"; vol. 92 (2008) pp. 1570-1578.
Han et al., "Evaluation of a Small Negative Transfer Gate Bias on the Performance of 4T CMOS Image Sensor Pixels," 2007 International Image Sensor Workshop, 238-240, Ogunquit, Maine.
Haug, et al.; "Light Trapping effects in thin film silicon solar cells"; 2009.
Her et al., "Microstructuring of Silicon with Femtosecond Laser Pulses," Applied Physics Letters, 1998, 1673-1675, vol. 73, No. 12, American Institute of Physics.
Her et al., "Novel Conical Microstructures Created in Silicon With Femtosecond Laser Pulses", CLEO 1998, 511-512, San Francisco, CA.
Her, et al., "Femtosecond laser-induced formation of spikes on silicon," Applied Physics A, 2000, 70, 383-385.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
High—Performance Technologies for Advanced Biomedical Applications; .COPYRGT. 2004Brochure; pp. 1-46; PerkinElmerOptoelectronics.
Holland; Fabrication of Detectors and Transistors on High-Resistivity Silicon; Nuclear Instruments and Methods in Physics Research, vol. A275, pp. 537-541 (1989).

Hong et al., "Cryogenic processed metal-semiconductor-metal (MSM) photodetectors on MBE grown ZnSe,", 1999, IEEE Transactions on Electron Devices, vol. 46, No. 6, pp. 1127-1134.
Hsieh et al., "Focal-Plane-Arrays and CMOS Readout Techniques of Infrared Imaging Systems," IEE Transactions on Circuits and Systems for Video Technology, 1997, vol. 7, No. 4, Aug. 1997, 594-605.
Hu et al., "Solar Cells from Basic to Advanced Systems," McGraw Hill Book Co., 1983, 39, New York, New York.
Huang, et al.; "Microstructured silicon photodetector"; Applied Physics Letters 89, 033506; 2006 American Institute of Physics; 2006.
Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.
Igalson et al. Defect States in the CIGS Solar cells by Photocapacitance and Deep Level Optical Spectroscopy; Bulletin of the Polish Academy of Sciences Technical Sciences; 2005; pp. 157-161; vol. 53(2).
"Infrared Absorption by Sulfur-Doped Silicon formed by Femtosecond Laser Irradiation"; Springer Berline/Heidelberg, vol. 79, Nov. 2004.
Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).
Joy, T. et al.; Development of a Production-Ready, Back-Illuminated CMOS Image Sensor with Small Pixels; Electron Devices Meeting; pp. 1007-1010; 2007; IEEE.
Juntunen et al.; Advanced Photodiode Detector for Medical CT Imaging: Design and Performance; 2007; pp. 2730-2735; IEEE.
Kim et al.; "Strong Sub-Band-Gap Infrared Absorption in Silicon Supersaturated with Sulfur"; 2006 Appl. Phys. Lett. 88, 241902-1-241902-3.
Koh et al., "Simple nanostructuring on silicon surfaceby means of focused beam patterning and wet etching", Applied Surface Science, 2000 pp. 599-603.
Kolasinski et al., "Laser Assisted and Wet Chemical Etching of Silicon Nanostructures," J. Vac. Sci. Technol., A 24(4), Jul./Aug. 2006, 1474-1479.
Konstantatos et al., "Engineering the Temproal Response of Photoconductive Photodetectors via Selective Introduction of Surface Trap States," Nano Letters, v. 8(5), pp. 1446-1450 (Apr. 2, 2008).
Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).
Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.
Kroning et al.; X-ray Imaging Systems for NDT and General Applications; 2002; Fraunhofer Institute for Nondestructive Testing; Saarbrucken and Dresden, Germany.
Kryski; A High Speed 4 Megapixel Digital CMOS Sensor; 2007 International Image Sensor Workshop; Jun. 6-10, 2007.
Li, "Design and Simulation of an Uncooled Double-Cantilever Microbolometer with the Potential for .about.mK NETD," 2004, Sensors and Actuators A, 351-359, vol. 112, Elsevier B.V.
Li et al., "Gettering in High Resistive Float Zone Silicon Wafers," Transaction on Nuclear Science, vol. 36(1), pp. 290-294 (Feb. 1, 1989).
Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.
Lin, A. et al.; Optimization of Random Diffraction Gratings in Thin-Film Solar Cells Using Genetic Algorithms; 2007; 1 page; SSEL Annual Report.
Low Dose Technologies; Power Point.
Madzharov, et al.; "Light trapping in thin-firm silicon solar cells for superstrate and substrate configuration" Abstract #1614, 218.sup.th ECS Meeting .COPYRGT. 2010 the Electrochemical Society.

(56) References Cited

OTHER PUBLICATIONS

"Masimo Rainbow SET Pulse CO-Oximetry," 2010, Masimo Corporation, Irvine, California, http://www.masimo.com/Rainbow/about.htm.
Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.
Matsuno, Shigeru et al.; Advanced Technologies for High Efficiency Photovoltaic Systems; Mitsubishi Electric Advance; vol. 122; pp. 17-19; Jun. 2008.
Meynants, et al.; "Backside illuminated global shutter COMOS image sensors"; 2011 International Image Sensor Workshop; Jun. 11, 2011.
Moloney, A.M. et al.; Novel Black Silicon PIN Photodiodes; 8 pages; Jan. 25, 2006; SPIE.
Moon et al. Selective emitter using porous silicon for crystalline silicon solar cells. Solar Energy Materials & Solar Cells, v. 93, pp. 846-850 (2009).
Moses; Nuclear Medical Imaging—Techniques and Challenges; Power Point; Feb. 9, 2005; Lawrence Berkeley National Laboratory Department of Functional Imaging.
Murkin, JM and Arangol, M, "Near Infrared spectroscopy as an index of rain and tissue oxygenation," Bri. J. of Anathesia (BJA/PGA Supplement):13-il3 (2009).
Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.
Myers, Richard et al., "Enhancing Near-IR Avalanche Photodiodes Performance by Femtosecond Laser Microstructuring" Harvard Dept. Of Physics.
Nauka et al., Intrinsic Gettering in Oxygen-Free Silicon; App. Phys. Lett., vol. 46(7), Apr. 4, 1985.
Nauka et al., "New Intrinsic Gettering Process in Silicon Based on Interactions of Silicon Interstitials," J. App. Phys., vol. 60(2), pp. 615-621, Jul. 15, 1986.
Nayak et al, "Semiconductor Laesr Crystallization of a—Si:H," SPIE Digital Library, 2003, 277-380, vol. 4977, Bellingham, Washington. 2003.
Nayak et al, "Ultrafast-Laser-Assisted Chemical Restructuring of Silicon and Germanium Surfaces," Applied Surface Science, 2007, 6580-6583, vol. 253, Issue 15, Elsevier B.V.
Nayak et al, "Semiconductor Laser Crystallization of a—Si:H on Conducting Tin-Oxide-Coated Glass for Solar Cell and Display Applications," Applied Physics A, 2005, 1077-1080, 80, Springer Berlin, Heidelberg, Germany.
Nayak, B.K. et al.; Ultrafast Laser Textured Silicon Solar Cells; Mater. Res. Soc. Symp. Proc.; vol. 1123; 6 pages; 2009; Materials Research Society.
Nayak, et al.; "Efficient light trapping in silicon solar cells by ultrafast-laser-induced self-assembled micro/nano structures"; Progress in Photovoltaics: Research and Applications; 2011.
Oden, et al.; "Optical and Infrared Detection Using Microcantilevers;" SPIE Digital Library on Oct. 13, 2010; vol. 2744; 10 pages.
Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.
Pain, Bedabrata; "A Back-Illuminated Megapixel CMOS Image Sensor"; http://hdl.handle.net/2014/39312; May 1, 2005.
Palm et al. CIGSSe Thin Film PB Modules: From Fundamental Investigators to Advanced Performance and Stability; Thin Solid Films; 2004; pp. 544-551; vol. 451-2.
Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.
Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.
Pedraza et al., "Surface Nanostructuring of Silicon", Appl. Phys. A, 2003, 77, 277-284.
Rashkeev et al., "Hydrogen passivation and Activation of Oxygen Complexes in Silicon," American Institute of Physics, vol. 78(11), pp. 1571-1573 (Mar. 12, 2001).
Russell, et al.; "Nanosecond Eximer Laser Processing for Novel Microelectronic Fabrication"; Nanosecond Excimer Laser Processing; 6 pages; 1989.
Russell, Ramirez, Kelley, "Nanosecond Excimer Laser Processing for Novel Microelectronic Fabrication," SSC Pacific Technical Reports , pp. 228-233, 2003, vol. 4, US Navy.
Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.
Sanchez et al., "Whiskerlike Structure Growth on Silicon Exposed to ArF Excimer Laser Irradiation", Appl. Phys. Lett., 1996, 69 (5), 620-622.
Sanchez et al., "Dynamics of the Hydrodynamical Growth of Columns on Silicon Exposed to ArF Excimer-Laser Irradiation", Appl. Phys. A, 66, 83-86 (1998).
Sarnet et al.; "Femtosecond laser for black silicon and photovoltaic cells"; Feb. 21, 2008, Proc. Of SPIE; vol. 6881; pp. 1-15.
Senoussaoui, N. et al.; Thin-Film Solar Cells with Periodic Grating Coupler; Thin Solid Films; pp. 397-401; 2003; Elsevier B.V.
Serpenguzel et al., "Temperature Dependence of Photluminescence in Non-Crystalline Silicon", Photonics West (San Jose, CA, 2004) 454-462.
Shen et al., "Formation of Regular Arrays of Silicon Micorspikes by Femotsecond Laser Irradiation Through A Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Solhusvik, J. et al. "A 1280x960 3.75um pixel CMOS imager with Triple Exposure HDR," Proc. of 2009 International Image Sensor Workshop, Bergen, Norway, Jun. 22-28, 2009.
Stone et al.; The X-ray Sensitivity of Amorphous Selenium for Mammography;.Am. Assoc. Phys. Med.; Mar. 2002; pp. 319-324; vol. 29 No. 3; Am. Assoc. Phys. Med.
Szlufcik, J. et al.; Simple Integral Screenprinting process for selective emitter polycrystalline silicon solar cells; Applied Physics Letters; vol. 59, No. 13; Sep. 23, 1991; American Institute of Physics.
Tabbal et al., "Formation of Single Crystal Sulfur Supersaturated Silicon Based Junctions by Pulsed Laser Melting". 2007, J. Vac. Sci. Technol. B25(6), 1847-1852.
Takayanagi, et al.; "A 600.times.600 Pixel, 500, fps CMOS Image Sensor with a 4.4 jum Pinned Photodiode 5-Transistor Global Shutter Pixel"; 2007 International Image Sensor Workshop; Jun. 6-10, 2007.
Tower, John R. et al.; Large Format Backside Illuminated CCD Imager for Space Surveillance; IEEE Transactions on Electron Devices, vol. 50, No. 1; Jan. 2003; pp. 218-224.
Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface-Trap Charge Pumping," IEICE Electronics Express, 2004, vol. 1, No. 18, 556-561.
Wilson, "Depth Distributions of Sulfur Implanted Into Silicon as a Function of Ion energy, Ion Fluence, and Anneal Temperature," 1984, Appl. Phys. 55(10, 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Wu et al., "Black Silicon" Harvard UPS 1999.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).

(56) References Cited

OTHER PUBLICATIONS

Wu, et al "Near-Unity Below-Band-Gap Absorption by Microstructured Silicon," 2001, Applied Physics Letters, 1850-1852, vol. 78, No. 13, American Institute of Physics.

Xu, Y., et al, "Infrared Detection Using Thermally Isolated Diode," Sensors and Actuators A, Elsevier Sequoia S.A., 1993, vol. 36, 209-217, Lausanne, Switzerland.

Yablonovitch, et al.; "Intensity Enhancement in Textured Optical Sheets for Solar Cells"; .COPYRGT. 1982 IEEE.

Yamamoto, K. et al.; NIR Sensitivity Enhancement by Laser Treatment for Si Detectors; Nuclear Instruments and Methods in Physics Research A; pp. 520-523; Mar. 31, 2010; Elsevier.

Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.

Yasutomi, et al.; "Two-Stage Charge Transfer Pixel Using Pinned Diodes for Low-Noise Global Shutter Imaging"; 2009 International Image Sensor Workshop; Mar. 28, 2009.

Younkin et al., "Infrared Absorption by Conical Silicon Microstructures Made in a Variety of Background Gases Using Femtosecond-Laser Pulses", J. Appl. Phys., 93, 2626-2629 (2003).

Younkin, "Surface Studies and Microstructure Fabrication Using Femtosecond Laser Pulses," Thesis presented to the Division of Engineering & Applied sciences at Harvard University (Aug. 2001).

Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.

Zaidi, S.H. et al.; Diffraction Grating Structures in Solar Cells; Photovoltaic Specialists Conference, 2000; 4 pages; Sep. 2000; IEEE.

Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.

Zhu et al., "Evolution of Silicon Surface Microstructures by Picosecond and Femtosecond Laser Irradiations," Applied Surface Science, 2005, 102-108, Elsevie, Amsterdam, NL.Ultra-Shallow P+-Junction Formation in Silicon by Excimer Laser Doping: a Heat and Mass Transfer Perspective, Int. J. Heat Mass Transfer, 1996, 3835-3844, vol. 39, No. 18, Elsevier Science Ltd., Great Britain.

Ziou et al., "Depth from defocus using the hermite transform", IMAGE PROCESSING, 1998. ICIP 98. Intl. Conference on Chicago, IL. Oct. 1998 pp. 958-962.

Agranov, et al., Pixel continues to shrink . . . Small Pixels for Novel CMOS Image Sensors, 4 pages.

Byung Jun Park et al, Jpn. J. Appl. Phys. 46 2454, 2007, 5 pages.

Campbell, Stephen A., "The Science and Engineering of Microeletronic Fabrication, 2nd Ed.", Oxford University Press, 2001, pp. 406-411.

Choubey et al., On Evolution of CMOS Image Sensors, Proceedings of the 8th International Conference on Sensing Technology, Sep. 2-4, 2014, Liverpool, UK, pages.

Fontaine, A Review of the 1.4 μm Pixel Generation, Technology Analysis Group Chipworks Inc., 2011, 4 pages.

Fontaine, Ray, A Survey of Enabling Technologies in Successful Consumer Digital Imaging Products (Part 3: Pixel Isolation Structures), http://www.techinsights.com, Jul. 24, 2017, 13 pages.

http://electroiq.com/insights-from-leading-edge/2016/09/iftle-303-sony-introduces-ziptronix-dbi-technology-in-samsung-galaxy-s7, "Omnivision was the first to sample BSI in 2007 but costs were too high and adoption was thus very low", (2016).

http://joseph-tang.blogspot.com/2017/, Oshiyama et al. , Near-infrared Sensitivity Enhancement of a Back-illuminated Complementary Metal Oxide Semiconductor Image Sensor with a Pyramid Surface for Diffraction Structure,(2017).

https://blogs.yahoo.co.jp/miyabiman_now/25628945.html.

IMEC, 3D Integrated Image Sensors for Smart Imaging Systems, Piet De Moor, 2010, 32 pages.

Itonaga et al., "Extremely-low-noise CMOS Image Sensor with high saturation capacity," 2011 International Electron Devices Meeting, Washington, DC, 2011, pp. 8.1.1-8.1.4.

Kitamura et al., "Suppression of crosstalk by using backside deep trench isolation for 1.12μm backside illuminated CMOS image sensor," 2012 International Electron Devices Meeting, San Francisco, CA, 2012, pp. 24.2.1-24.2.4.

Korean Intellectual Property Office (KIPO), CMOS Image Sensor, KIPO, 2004, 29 pages.

Lee et al., SNR Performance Comparison of 1.4μm Pixel : FSI, Light-guide, and BSI, 2011, 3 pages.

Minoglou et al., "Reduction of Electrical Crosstalk in Hybrid Backside Illuminated CMOS Imagers using Deep Trench Isolation," 2008 International Interconnect Technology Conference, Burlingame, CA, USA, 2008, pp. 129-131.

Munck, Generic building blocks for 3D integration and their application on hybrid CMOS image sensors, Katholieke Universiteit Leuven, Kapeldreef 75—B-3001 Heverlee, Sep. 2008, 328 pages.

Ohring, Milton."The Materials of Science of Thin Films"; pp. 176-179; Academic Press, 1992.

Park et al., "Deep Trench Isolation for Crosstalk Suppression in Active Pixel Sensors with 1.7μm Pixel Pitch", in Japanese Journal of Applied Physics, vol. 46, No. 4B, pp. 2454-5457, 2007.

Rao, et al., Monolithic and Fully-Hybrid Backside Illuminated CMOS Imagers for Smart Sensing, IMEC, Kapeldreef 75, B-3001 Leuven, Belgium, 4 pages.

STMicroelctronics, BSI—technical challenges, IISW-2009, Bergen. Jun. 25, 2009, 37 pages.

Tournier, et al., Pixel-to-Pixel isolation by Deep Trench technology, STMicroelectronics, 850, rue Jean Monnet—F-38926 Crolles Cedex—France, 2011, 4 pages.

Tournier, et al., Pixel-to-Pixel isolation by Deep Trench technology: Application to CMOS Image Sensor, https://www.researchgate.net/publication/268300742, 2011, 5 pages.

Xiong, Y., et al, "Depth from focusing and defocusing", Computer Vision and Pattern Recognition, 1993. Proceedings CVPR '93., 1993 IEEE , Los Alamitos, CA, USA.IEEE Comput. Soc, Jun. 15, 1993 (Jun. 15, 1993), pp. 68-73.

Yaung et al., "High performance 300mm backside illumination technology for continuous pixel shrinkage," 2011 International Electron Devices Meeting, Washington, DC, 2011, pp. 8.2.1-8.2.4.

Aberle, Progress with polycrystalline silicon thin-film solar cells on glass at UNSW. Journal of Crystal Growth 287,386-390 (2006).

Amoruso et al., Emission of nanoparticles during ultrashort laser irradiation of silicon targets. Europhysics Letters 67, 404-410 (2004).

Arango et al., Charge transfer in photovoltaics consisting of interpenetrating networks of conjugated polymer and TiO2 nanoparticles. Applied Physics Letters 74, 1698-1700 (1999).

Beek et al., Efficient hybrid solar cells from zinc oxide nanoparticles and a conjugated polymer. Advanced Materials 16, 1009-1013 (2004).

Bentini et al., Surface doping of semiconductors by pulsed-laser irradiation in reactive atmosphere. Applied Physics A: Materials Science & Processing. 1988;45(4):317-324.

Blood et al., Electrical Characterization of Semiconductors. Reports on Progress in Physics 41, 157-257 (1978).

Bouhdata, A. et al. "Modeling of the Spectral Response of PIN Photodetectors Impact of Exposed Zone Thickness, Surface Recombination Velocity and Trap Concentration", Microelectronics Reliability 44, pp. 223-228 (2004).

Brus, Luminescence of Silicon Materials-Chains, Sheets, Nanoclystals, Nanowires, Microcrystals, and Porous Silicon. Journal of Physical Chemistry 98,3575-3581 (1994).

Bucksbaum et al., Rapid Melting and Regrowth Velocities in Silicon Heated by Ultraviolet Picosecond Laser-Pulses, Physical Review Letters 53, 182-185 (1984).

Bulgakov et al., Silicon clusters produced by femtosecond laser ablation: non-thermal emission and gas-phase condensation. Applied Physics AMaterials Science & Processing 79, 1591-1594 (2004).

Campbell et al., Light Trapping Properties of Pyramidally Textured Surfaces. Journal of Applied Physics 62, 243-249 (1987).

(56) References Cited

OTHER PUBLICATIONS

Carey et al, "High Sensitivity Silicon-Based VIS/NIR Photodetectors", CLEO 2004 (San Francisco, CA 2004) pp. 1-2.
Carey et al. "High Sensitivity Silicon-Based Visnir Photodetectors" CLEO 2004 (San Francisco CA 2003) 1-2.
Carey et al., In-situ doping of silicon using the gas immersion laser doping (GILD) process. Applied Surface Science. vol. 43, Issues 1-4, Dec. 2, 1989, pp. 325-332.
Carey et al., Visible and near-infared responsivity of femtosecondlaser microstrnctured silicon photodiodes. Opt. Lett. 2005;30: 1773-5.
Carey, Femtosecond-laser microstructuring of silicon for novel optoelectronic devices. Thesis. The Division of Engineering and Applied Sciences. Harvard University. Cambridge, MA. Jul. 2004 162 pages.
Cifre, Polycrystalline Silicon Films Obtained by Hot-Wire Chemical- Vapor-Deposition. Applied Physics aMaterials Science & Processing 59, 645-651 (1994).
Contreras et al., Progress toward 20% efficiency in Cu(In,Ca)Se-2 polycrystalline thin-film solar cells. Progress in Photovoltaics 7, 311-316 (1999).
Cuadra et al., Present status of intermediate band solar cell research. Thin Solid Films 451-52, 593-599 (2004).
Curtins et al., High-Rate Deposition of Amorphous Hydrogenated Silicon-Effect of Plasma Excitation-Frequency. Electronics Letters 23, 228-230 (1987).
Delley et al., Quantum Confinement in Si Nanocrystals. Physical Review B 47, 1397-1400 (1993).
Glezer et al., Ultrafast-laser driven micro-explosions in transparent materials. Applied Physics Letters 71, 882-884 (1997).
Glover et al., Probing paiticle synthesis during femtosecond laser ablation: initial phase transition kinetics. Applied Physics B Lasers and Optics 78, 995-1000 (2004).
Glover, Hydrodynamics of particle formation following femtosecond laser ablation. Journal of the Optical Society of America B-Optical Physics 20, 125-131 (2003).
Goetzbergeret al., Crystalline Silicon Solar Cells (ed.), Chapter 6, High Efficiency Solar Cells. New York: John Wiley & Sons Ltd, 1994.
Green, Recent developments in photovoltaics. Solar Energy 76, 3-8 (2004).
Greenham et al.,Charge sepai•ation and transport in conjugatedpolymerjsemiconductor-nanocrystal composites studied by photoluminescence quenching and photoconductivity. Physical Review B 54, 17628-17637 (1996).
Halls et al., Efficient Photodiodes from Interpenelsating Polymer Networks. Nature 376, 498-500 (1995).
Hansen, Henri et al. "The Black Silicon Method: A Universal Method for determining the Parameter Setting of a Fluorine-Based Reactive Ion Etcher in Depp Silicon Trench Etching With Profile Control", J. Micromedch. Microeng. 5 (1'995) pp. 115-120.
Heisterkamp et al., Pulse energy dependence of subcellular dissection by femtosecond laser pulses. Optics Express 13, 3690-3696 (2005).
Herny, Limiting Efficiencies of Ideal Single and Multiple Energy Gap Terrestrial Solar-Cells. Journal of Applied Physics 51, 4494-4500 (1980).
Huang et al., "A uniform 290 nm periodic Square Strcuture on ZnO Fabricated by Two-Beam Femtosecond Laser Ablation," Nanotechnolgoy, 8 pp. 1-6 (2007).
Keppner et al., Passivation Properties of Amorphous and Microcrystalline Silicon Layers Deposited by Vhf-Gd for Crystalline Silicon Solar-Cells. Solar Energy Materials and Solar Cells 34, 201-209 (1994).
Luque et al., Increasing the efficiency of ideal solar cells by photon induced transitions at intermediate levels. Physical Review Letters 78, 5014-5017 (1997).
Marti et al., Limiting efficiencies for photovoltaic energy conversion in multigap systems. Solar Energy Materials and Solar Cells 43, 203-222 (1996).

Meier et al., Recent progress in micromorph solar cells. Journal of Non-Crystalline Solids 230, 1250-1256 (1998).
Meier etal., Complete Microc lystalline P-1-N. SolarCell-Crystalline or Amorphous Cell Behavior. Applied Physics Letters 65, 860-862 (1994).
Mo et al., Sulfm point defects in crystalline and amorphous silicon. Physical Review B 70 (2004).
Morneault, K. et al., "ISDN Q.921-User Adaptation Layer," Network Working Group, Request for Comments: 3057, The Internet Society, pp. 1-66, (2001).
Morneault, K. et al., "SS7 MTP2-User Adaptation Layer," Network Working Group, Internet Draft, The Internet Engineering Task Force, pp. 1-94, (Feb. 2001).
Myers et al., Enhancing nearinfrared avalanche photodiode performance by femtosecond laser microstructuring. Applied Optics 45, 8825-8831 (2006).
Nayak et al.; "Femtosecond Laser-Induced Micro-Structuring of Thin a-Si:H Films", Material Research Society Symposium proceeedings; vol. 850; Nov. 28-Dec. 2, 2004; pp. MM1.8.1-MM 1.8.5.
Nirmal et al., Lwninescence photophysics in semiconductor nanocrystals. Accounts of Chemical Research 32. 407-414 (1999).
Ong et al., "Framework Architecture for Signaling Transport," Network Working Group, Request for Comments: 2719, The Internet Society, pp. 1-24, (Oct. 1999).
O'Regan et al., A Low-Cost, High-Efficiency Solar-Cell Based on DyeSensitized Colloidal Tio2 Films. Nature 353, 737-740 (1991).
Pavesi, Optical gain in silicon nanocrystals. Nature 408, 440-444 (2000).
Rath et al., Limited influence of grain boundary defects in hot-wire CVD polysilicon films on solar cell performance. Journal of Non-crystalline Solids 230, 1277-1281 (1998).
Reber et al., Crystalline silicon thin-film solar cellsrecent results at Fraunhofer ISE, Solar Energy 77, 865-875 (2004).
Sarnet et al., Laser doping for microelectronics and microtechnology. Proc.of SPIE vol. 5448 pp. 669-680.
Schaffer et al., Micromachining bulk glass by use offemtosecond laser pulses with nanojoule energy. Optics Letters 26, 93-95(2001).
Schuppler et al., Size, Shape, and Composition of Luminescent Species in Oxidized Si Nanocrystals and H-Passivated Porous Si. Physical Review B 52, 4910-4925 (1995).
Serpenguzel et al., "Temperature Dependence of Photoluminescence in Non-Crystalline Silicon", Photonics West (San Jose, CA, 2004) 454-462.
Seto, Electrical Properties of Polyclystalline Silicon Films. Jomnal of Applied Physics 46, 5247-5254 (1975).
Shali et al., Thin-film silicon solar cell technology. Progress in Photovoltaics 12, 113-142 (2004).
Sheehy et al., Chalcogen doping of silicon via intense femtosecondlaser irradiation. Materials Science and Engineering B-Solid State Materials for Advanced Technology 137, 289-294 (2007).
Sheehy et al., Role of the Background Gas in the Morphology and Optical Properties of Laser-Microstructured Silicon. Chem Mater. 2005; 17(14):3582-6.
Shen et al., "Femtosecond laser-induced formation of submicrometer spikes on silicon in water", Appllied Physics Letter, vol. 85(23), p. 5694 (2004).
Shockley et al., Detailed Balance Limit ofEfficiency of p-n. Junction Solar Cells. Journal of Applied Physics 32,510-519 (1961).
Sidebottom, G. et al., "SS7 MTP3-User Adaptation Layer (M3UA)," Network Working Group, Internet Draft, The Internet Engineering Task Force, pp. 1-128, (Feb. 2001).
Sipe et al., Laser-Induced Periodic Surface-Structure .1. Theory. Physical Review B 27, 1141-1154 (1983).
Slaoui et al., Advanced inorganic materials for photovoltaics. Mrs Bulletin 32, 211-218 (2007).
Staebler et al., Stability of N-I-P. Amorphous-Silicon Solar-Cells. Applied Physics Letters 39, 733-735 (1981).
Stalmans et al. Porous silicon in crystalline silicon solar cells: A review and the effect on the internal quantum efficiency. Progress in Photovoltaics 6 233-246 ( 1998).
Stewart, R. et al. "Stream Control Transmission Protocol", Network Working Group, pp. 1-134 (Oct. 2000).

(56) References Cited

OTHER PUBLICATIONS

Stocks et al., Texturing ofpolycrystalline silicon. Solar Energy Materials and Solar Cells 40, 33-42 (1996).
Stupca et al., Enhancement of polycrystalline silicon solar cells using ultrathin films of silicon nanoparticle. Applied Physics Letters 91, Jun. 31, 2007 (2007).
Svrcek et al., Ex situ prepared Si nanocrystals embedded in silica glass: Formation and characterization. Journal of Applied Physics 95, 3158-3163 (2004).
Svrcek et al., Silicon nanocrystals as light converter for solar cells. Thin Solid Films 451-52, 384-388 (2004).
Tiwari et al., A silicon nanocrystals based memo1y. Applied Physics Letters 68, 1377-1379 (1996).
Torres et al., Device grade microcrystalline silicon owing to reduced oxygen contamination, Applied Physics Letters 69, 1373-1375 (1996).
Tull et al., Formation of silicon nanoparticles and web-like aggregates by femtosecond laser ablation in a background gas. Applied Physics a-Materials Science & Processing 83, 341-346 (2006).
Tull et al., Silicon surface morphologies after femtosecond laser irradiation, Mrs Bulletin 31, 626-633 (2006).
van der Zel, L. "SF6 and the Environment," EPRI, Nov. 2003.
Vigue, F. et al. "Visible-blind Ultraviolet Photodetectors based on ZnMgBeSe" Journal of Electronic Materials, vol. 30, No. 6, pp. 4190-4192 (2001).
Wilson et al., Quantum Confinement in Size-Selected, Surface-Oxidized Silicon Nanocrystals. Science 262, 1242-1244 (1993).
Wronski, Electronic Properties of Amorphous Silicon in Solar-Cell Operation Ieee Transactions on Electron Devices 24, 351-357 (1977).
Wu et al., "13.9%—efficient CdTe polycrystalline thin-film solar cells with an infrared transmission of ~so%", Progress in Photovoltaics 14, 471-483 (2006).
Younkin, R. et al. "Infrared absorption by conical silicon microstrnctures made in a variety of background gases using femtosecond-laserpulses," Proc. CLEO 2001 (Baltimore, MD, 2001) p. 556.
Yu et al., Polymer Photovoltaic CellsEnhanced Efficiencies Via a Network oflnternal Donor-Acceptor Heterojunctions. Science 270, 1789-1791 (1995).
Zhao et al., 19.8% efficient "honeycomb" textured multicrystalline and 24.4% monocrystalline silicon solar cells. Applied Physics Letters 73, 1991-1993 (1998).

* cited by examiner

| 106 | 102 | 106 | 102 |
|-----|-----|-----|-----|
| 104 | 106 | 104 | 106 |
| 108 | 109 | 108 | 109 |
| 106 | 102 | 106 | 102 |
| 104 | 106 | 104 | 106 |
| 108 | 109 | 108 | 109 |

HIGH SPEED PHOTOSENSITIVE DEVICES AND ASSOCIATED METHODS

PRIORITY DATA

The present application claims priority as a continuation application of U.S. patent application Ser. No. 14/580,143 filed on Dec. 14, 2014, which claims priority as a continuation of U.S. patent application Ser. No. 13/164,630, filed on Jun. 20, 2011, which claims the benefit of U.S. Provisional Patent Application Ser. No. 61/356,536, filed on Jun. 18, 2010, all of which are incorporated herein by reference.

BACKGROUND

Many imaging applications such as hands-free gesture control, video games, medical, and machine vision, as well as communication applications utilize various optoelectronic devices, such as photodetectors and imaging arrays of photodetectors. Communication applications typically use, for example, fiber optical networks because such networks perform well in the near infrared wavelengths of light where optical fibers experience lower signal loss. Applications for laser marking and range finding commonly use lasers with near infrared wavelengths such 1064 nm. Other applications such as depth perception applications utilize imagers that can detect near infrared wavelengths such as 850 nm or 940 nm. These wavelengths are commonly generated from light emitting diodes or laser diodes made with gallium arsenide (GaAs). All of these applications require detectors or detector arrays with fast response time, typically faster than what can be achieved with a thick (eg >100 um) thick active layer of silicon. Therefore, the silicon devices utilized for these applications are often thin and have specific design considerations included to reduce response time. However, as the active layer of silicon becomes thinner, the response at longer wavelengths (eg 850 nm, 940 nm, and 1064 nm) because much lower than that of a thick silicon device layer. Thick silicon devices with high response at longer wavelengths, on the other hand, have slow response time and are difficult to deplete.

SUMMARY

The present disclosure provides high speed optoelectronic devices and associated methods. In one aspect, for example, a high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm. In another aspect, the optoelectronic device has a responsivity of greater than or equal to about 0.5 A/W for electromagnetic radiation having at least one wavelength from about 800 nm to about 1200 nm. In yet another aspect, the optoelectronic device has a responsivity of greater than or equal to about 0.45 A/W for electromagnetic radiation having a wavelength of about 850 nm. In a further aspect, the silicon material has a thickness of from about 1 μm to about 100 μm. In yet a further aspect, dark current of the device during operation is from about 100 pA/cm$^2$ to about 10 nA/cm$^2$.

In another aspect, a high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.3 A/W for electromagnetic radiation having a wavelength of about 940 nm.

In yet another aspect, high speed optoelectronic device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.05 A/W for electromagnetic radiation having a wavelength of about 1060 nm.

In another aspect, a photodiode array can include a silicon material having an incident light surface, at least two photodiodes in the silicon material, each photodiode including a first doped region and a second doped region forming a junction, and a textured region coupled to the silicon material and positioned to interact with electromagnetic radiation. The photodiode array has a response time of from about 1 picosecond to about 5 nanoseconds and a responsivity of greater than or equal to about 0.4 A/W for electromagnetic radiation having at least one wavelength from about 800 nm to about 1200 nm. In one aspect, the silicon material has a thickness of from about 1 μm to about 100 μm.

In yet another aspect, a method of increasing the speed of an optoelectronic device can include doping at least two regions in a silicon material to form at least one junction, and texturing the silicon material to form a textured region positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm. In one aspect, the device can include a further doped region intended to quickly bring carriers from the side opposite junction to the junction region.

DETAILED DESCRIPTION

Figure 1:
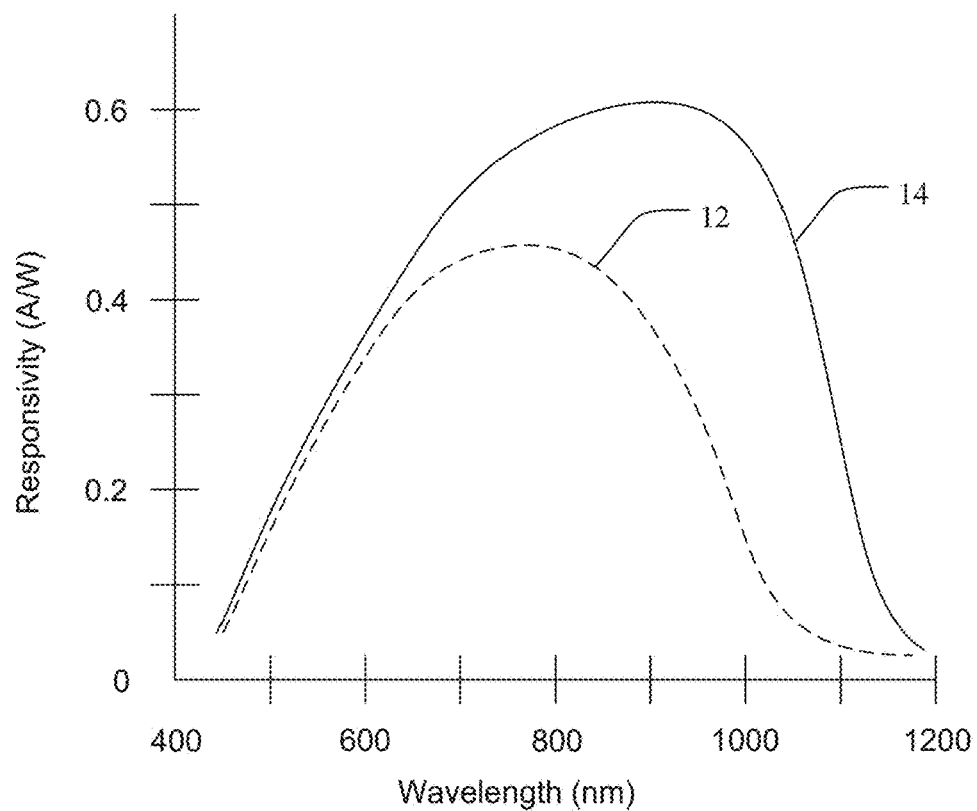
FIG. 1 is a graphical representation of the absorption characteristics of a fast (or thin) photodetector device based on standard silicon compared to the absorption characteristics of a photodetecting device based on silicon but having a textured region in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" can include plural referents unless the context clearly dictates otherwise. Thus, for example, reference to "a dopant" can include one or more of such dopants and reference to "the layer" can include reference to one or more of such layers.

As used herein, "quantum efficiency" (QE) is defined as the percentage of photons incident on an optoelectronic device that are converted into electrons. External QE (EQE) is defined as the current obtained outside of the device per incoming photon. As such, EQE therefore depends on both the absorption of photons and the collection of charges. The EQE is lower than the QE due to recombination effects and optical losses (e.g. transmission and reflection losses).

As used herein, "responsivity" is a measure of the input-output gain of a detector system. In the case of a photodetector, responsivity is a measure of the electrical output per optical input. Responsivity of a photodetector is expressed in amperes per watt of incident radiant power. Additionally, responsivity is a function of the wavelength of the incident radiation and of the properties of the device, such as the bandgap of the material of which the device is made. One expression for responsivity ($R_\lambda$) is shown in Equation I, where $\eta$ is the external quantum efficiency of the detector for a given wavelength ($\lambda$), q is the charge of an electron, h is Planks constant, and $\nu$ is the frequency of light.

$$R_\lambda = \frac{q}{h\nu} \times \eta \approx \frac{\lambda_{(\mu m)}}{1.23985} \times \eta \qquad (I)$$

As used herein, the terms "electromagnetic radiation" and "light" can be used interchangeably, and can represent wavelengths across a broad range, including visible wavelengths (approximately 350 nm to 800 nm) and non-visible wavelengths (longer than about 800 nm or shorter than 350 nm). The infrared spectrum is often described as including a near infrared portion of the spectrum including wavelengths of approximately 800 to 1300 nm, a short wave infrared portion of the spectrum including wavelengths of approximately 1300 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, "response time" refers to the rise time or fall time of a detector device. In one aspect, "rise time" is the time difference between the 10% point and the 90% point of the peak amplitude output on the leading edge of the electrical signal generated by the interaction of light with the device. "Fall time" is measured as the time difference between the 90% point and the 10% point of the trailing edge of the electrical signal. In some aspects, fall time can be referred to as the decay time.

As used herein, the terms "disordered surface" and "textured surface" can be used interchangeably, and refer to a surface having a topology with nano- to micron-sized surface variations. Such a surface topology can be formed by the irradiation of a laser pulse or laser pulses, chemical etching, lithographic patterning, interference of multiple simultaneous laser pulses, or reactive ion etching. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 1 µm to about 60 µm). In yet another aspect, the surface can include nano-sized and/or micron-sized structures from about 5 nm and about 500 µm.

As used herein, the term "fluence" refers to the amount of energy from a single pulse of laser radiation that passes through a unit area. In other words, "fluence" can be described as the energy density of one laser pulse.

As used herein, the terms "surface modifying" and "surface modification" refer to the altering of a surface of a semiconductor material using laser irradiation, chemical etching, reactive ion etching, lithographic patterning, etc. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a semiconductor material.

As used herein, the term "target region" refers to an area of a semiconductor material that is intended to be doped or surface modified. The target region of a semiconductor material can vary as the surface modifying process progresses. For example, after a first target region is doped or surface modified, a second target region may be selected on the same semiconductor material.

As used herein, the term "detection" refers to the sensing, absorption, and/or collection of electromagnetic radiation.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

Many applications for optoelectronic devices can benefit from high speed operation. For example, a photodetector used in applications such as communicating data, laser range finding, laser marking, time of flight imaging, and the like, can be a limiting factor in how fast data can be transmitted. Thus, a photodetector having a faster responsivity can receive data at a correspondingly higher rate. The speed of many optoelectronic devices such as photodetectors is dependent, at least in part, on the speed with which charge carriers are swept from the photodetector. The speed at which carriers are swept from a photodetector can depend on the distance a carrier has to travel, whether the carriers are generated in a region of the device with an electric field, and the likelihood of a carrier being trapped or slowed in a defect within the device layer. In some cases, a bias can be applied to the photodetector to decrease the response time by increasing the drift velocity of the carriers. Additionally, many traditional data communication applications utilize electromagnetic radiation in the red and infrared spectrum as a data carrier. In a typical silicon device, electromagnetic radiation in the red and infrared spectrum generate carriers deep into the silicon device, thus increasing the distance the carrier has to travel to be collected. Thus it can be beneficial for a photodetector to absorb infrared radiation in a thin device in order to increase communication speeds and to reduce dark current.

Silicon is one material that can be used as a photodetector semiconductor. Thin silicon photodetectors are limited, however, in their ability to detect infrared wavelengths, particularly when functioning at higher data communication speeds. Traditional silicon materials require substantial absorption depths to detect photons having wavelengths longer than about 700 nm. While visible light can be absorbed at relatively shallow depths in silicon, absorption of longer wavelengths (e.g. 900 nm) in silicon of a thin wafer depth (e.g. approximately 100 µm) is poor if at all. Because short wave infrared light is mostly transparent to silicon-based photodetectors, other materials (e.g. InGaAs) have traditionally been used to detect infrared electromagnetic radiation having wavelengths greater than about 1100 nm. Using such other materials, however, is expensive, increases dark current relative to silicon devices, and limits the detection of electromagnetic radiation in the visible spectrum (i.e. visible light, 350 nm-800 nm). As such, silicon is often used because it is relatively cheap to manufacture and can be used to detect wavelengths in the visible spectrum.

Accordingly, the present disclosure provides optoelectronic devices and associated methods that increase the electromagnetic radiation absorption range of thin silicon devices into the infrared region, thus allowing the absorption of visible and infrared light by such devices. Additionally, such devices can be configured to operate at much higher data rates and have increased external quantum efficiencies and responsivities as compared to traditional thin silicon devices operating in the infrared spectrum. In one aspect, for example, a silicon photodetector is provided that includes a textured region to increase the absorption, external quantum efficiency, and to decrease response times in the infrared wavelengths. Such unique and novel devices can operate at high data rates in the visible and infrared spectrums. Such an increased sensitivity in a silicon-based device can thus reduce processing cost of photodetectors, reduce the power needed in light sources, increase the depth resolution in 3D types imaging, increase the distance over which data can be transmitted, improve laser range finding, and increases opportunities to use longer wavelengths of electromagnetic radiation for communicating data.

In one aspect, for example, a high speed optoelectronic device is provided. Such a device can include a silicon material having an incident light surface, a first doped region and a second doped region forming a semiconductive junction in the silicon material, and a textured region coupled to the silicon material and positioned to interact with electromagnetic radiation. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm. For example, FIG. 1 shows an absorption/responsivity graph where the dashed line 12 represents the absorption characteristics of a photodetector device based on standard fast silicon device and the solid line 14 represents the absorption characteristics of a photodetecting device based on silicon but having a textured region. Notably, the absorption of a standard fast silicon photodiode in the infrared, i.e. the 800 nm to 1200 nm region, results in relatively low responsivity.

Additionally, in one aspect the response time of the optoelectronic device is from about 1 picosecond to about 1 nanosecond. In another aspect, the response time of the optoelectronic device is from about 1 picosecond to about 500 picoseconds.

In another aspect, the optoelectronic device has a responsivity of greater than or equal to about 0.5 A/W for electromagnetic radiation having at least one wavelength from about 800 nm to about 1200 nm. In yet another aspect, the optoelectronic device has a responsivity of greater than or equal to about 0.45 A/W for electromagnetic radiation having a wavelength of about 850 nm. In a further aspect, the optoelectronic device has a responsivity of greater than or equal to about 0.3 A/W for electromagnetic radiation having a wavelength of about 940 nm. In yet a further aspect, the optoelectronic device has a responsivity of greater than or equal to about 0.05 A/W for electromagnetic radiation having a wavelength of about 1060 nm.

In some aspects, the thickness of the device can dictate the responsivity and response time. However standard silicon devices need to be thick, i.e. greater than 100 µm in order to detect wavelengths in the infrared spectrum, and such detection with thick devices results in a slow response and high dark current. It has now been discovered that a textured region positioned to interact with electromagnetic radiation can increase the absorption of infrared light in a device, thereby improving the infrared responsivity while allowing for fast operation. Diffuse scattering and reflection can result in increased path lengths for absorption, particularly if combined with total internal reflection, resulting in large improvements of responsivity in the infrared for silicon photodiodes, photodetectors, photodiode arrays, and the like. Because of the increased path lengths for absorption, thinner silicon materials can be used to absorb electromagnetic radiation up into the infrared regions. One advantage of thinner silicon material devices is that charge carriers are more quickly swept from the device, thus decreasing the response time. Conversely, thick silicon material devices sweep charge carriers therefrom more slowly, at least in part due to diffusion.

Thus, the devices of the present disclosure increase the absorption path length of silicon materials by increasing the absorption path length for longer wavelengths as compared to traditional silicon devices. The absorption depth in silicon photodetectors is the depth into silicon at which the radiation intensity is reduced to about 36% of the value at the surface of the silicon material. The increased absorption path length results in an apparent reduction in the absorption depth, or a reduced apparent or effective absorption depth. For example, the effective absorption depth of silicon can be reduced such that longer wavelengths can be absorbed at depths of less than or equal to about 100 µm. By increasing the absorption path length, such devices are able to absorb longer wavelengths (e.g. >1000 nm for silicon) within a thin semiconductor material. In addition to decreasing the effective absorption depth, the response time can be decreased using thinner semiconductor materials.

Accordingly, optoelectronic devices according to aspects of the present disclosure provide, among other things, enhanced response in the infrared light portion of the optical spectrum and improved response and quantum efficiency in converting electromagnetic radiation to electrical signals. As such, high quantum efficiencies and high speeds can be obtained in the infrared for devices thinner than about 100 µm. In other words, the response is higher than that found in thicker devices at infrared wavelengths.

Figure 2:
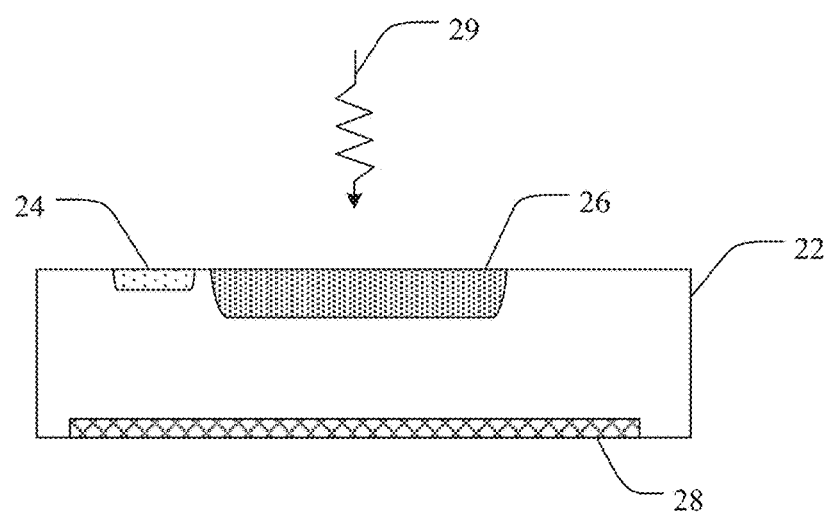
FIG. 2 is a schematic view of a photosensitive device in accordance with another aspect of the present disclosure.

In one aspect, as is shown in FIG. 2 for example, an optoelectronic device can include a silicon material 22 having a first doped region 24 and a second doped region 26 associated therewith. The first and second doped regions thus form a semiconductive junction. Numerous configurations are contemplated, and any type of junction configuration is considered to be within the present scope. For example, the first and second doped regions can be distinct from one another, contacting one another, overlapping one another, etc. In some cases, an intrinsic region can be located at least partially between the first and second doped regions.

The optoelectronic device can also include a textured region 28 coupled to the silicon material 22 and positioned to interact with incoming electromagnetic radiation 29. In this case, the textured region is located on a side of the silicon material that is opposite to the first doped region 24 and the second doped region 26. Electromagnetic radiation that passes through the silicon material to contact the textured region can be reflected back through the silicon material, thus effectively increasing the absorption path length of the silicon material. The textured region can be associated with an entire surface of the silicon material or only a portion thereof. Additionally, in some aspects the textured region can be specifically positioned to maximize the absorption path length of the silicon material. In other aspects, a third doping can be included near the textured region to improve the collection of carriers generated near the textured region.

The silicon material can be of any thickness that allows electromagnetic radiation detection and conversion functionality, and thus any such thickness of silicon material is considered to be within the present scope. Although any thickness of the silicon material is considered to be within the present scope, thin silicon layer materials can be particularly beneficial in decreasing the response time and/or the capacitance of the device. As has been described, charge carriers can be more quickly swept from thinner silicon material layers as compared to thicker silicon material layers. The thinner the silicon, the less material the electron/holes have to traverse in order to be collected, and the lower the probability of a generated charge carrier encountering a defect that could trap or slow the collection of the carrier. Thus one objective to implementing a fast photo response is to utilize a thin silicon material for the body region of the photodiode. Such a device can be nearly depleted of charge carriers by the built in potential of the photodiode and any applied bias to provide for a fast collection of the photo generated carriers by drift in an electric field. Charge carriers remaining in any undepleted region of the photodiode are collected by diffusion transport, which is slower than drift transport. For this reason, it is desirable to have the thickness of any region where diffusion may dominate to be much thinner than the depleted drift regions. In silicon materials having the proper doping provides a depletion region of about 10 µm with no applied bias. As such, in some aspects it can be useful to utilize a silicon material layer having a thickness less of less than about 100 µm, or less than about 10 µm. In another aspect, the silicon material can have a thickness and substrate doping concentration such that an applied bias generates an electrical field sufficient for saturation velocity of the charge carriers. It should be noted that operating a photodiode, as disclosed herein, at a zero bias can result in low noise but at a longer response time. When bias is applied however, the dark current is increased, resulting in higher noise, but with a decreased response time. The increased dark current can be compensated if the incident radiation signal is strong. The amount of dark current increase can be minimized, however, with a thinner device layer.

Accordingly, in one aspect the silicon material has a thickness of from about 1 µm to about 100 µm. In another aspect, the silicon material has a thickness of from about 1 µm to about 50 µm. In yet another aspect, the silicon material has a thickness of from about 5 µm to about 10 µm. In a further aspect, the silicon material has a thickness of from about 1 µm to about 5 µm.

As has been described, the response time of an optoelectronic device is limited by the transit time of the photo generated carriers across the thickness of the substrate. The RC time constant of the load resistance, (R) and the capacitance (C) of the entire electronic device structure can be kept less than this transit time value by using small load resistors and keeping the capacitance of the photodiodes small by limiting the doping density of the silicon material and area of the photodiodes. For example, photodiodes doped at $10^{15}/cm^3$ can have a capacitance that may be 10 nF/cm² without any applied bias. Small area photodiodes with 50 ohm load resistors can have very fast RC time constants. A photodiode with an area of 0.01 cm² can have a RC time constant of 0.5 nanoseconds. Given that the response time will be limited by the maximum charge carrier transit time across the photodiode, then diffusion rates can place an upper limit on the response time for photodiodes of different thickness. For example, if the photodiodes have a thickness of less than d=100 µm, then the diffusion transit time can be calculated by Equation (II) below, where D is the diffusion coefficient for electrons.

$$\frac{d^2}{2D} \quad \text{(II)}$$

The response time is bound by an upper limit of 2 µs. For light having a wavelength of about 900 nm, only about 35% is absorbed in the first pass or a device thinner than 100 µm and approximately 30% is reflected at the first surface, thereby giving a responsivity on the order 10% or 0.1 A/W. The responsivity, R, can be increased at least five fold by using multiple internal reflections to achieve a value of R=0.5 A/W.

In one aspect, a photodiode can have a thickness of less than about d=10 µm. Using equation (I) above, the resultant upper response time limit is about 20 ns. For light having a wavelength of about 700 nm with about 33% absorbed in the first pass and about 30% being reflected at the first surface, the responsivity can be on the order 10% or 0.3 Ampere/Watt. The responsivity, R, can be increased at least two fold by using multiple internal reflections as described herein to achieve a value of R=0.6 A/W.

In one aspect, for example, an optoelectronic device has a response time of from about 100 picoseconds to about 1 nanosecond. In another aspect, an optoelectronic device has a responsivity of from about 0.4 A/W to about 0.55 A/W for at least one wavelength of from about 800 nm to about 1200 nm relative to standard silicon. In yet another aspect, an optoelectronic device has a responsivity of from about 0.1 A/W to about 0.55 A/W for at least one wavelength of from about 1000 nm to about 1200 nm relative to standard silicon. In another aspect, the optoelectronic device has an increased external quantum efficiency of at least 10% for at least one wavelength of from about 550 nm to about 1200 nm relative to a silicon device with comparable thickness and response time. In yet another aspect, an optoelectronic device has a data rate greater than or equal to about 1 Gbs. In a further aspect, an optoelectronic device has a data rate greater than or equal to about 2 Gbs.

As has been described, optoelectronic devices according to aspects of the present disclosure can exhibit lower levels of dark current as compared to traditional devices. Although a variety of reasons are possible, one exemplary reason may be that a thinner silicon material layer can have fewer crystalline defects responsible for the generation of dark current. In one aspect, for example, the dark current of an optoelectronic device during operation is from about 100 pA/cm² to about 10 nA/cm². In another aspect, the maximum dark current of an optoelectronic device during operation is less than about 1 nA/cm².

Various types of silicon materials are contemplated, and any such material that can be incorporated into an optoelectronic device is considered to be within the present scope. In one aspect, for example, the silicon material is monocrystalline. In another aspect, the silicon material is multicrystalline. In yet another aspect, the silicon material is microcrystalline.

The silicon materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. In one aspect, the silicon material is epitaxially grown.

As has been described, the textured region can function to diffuse electromagnetic radiation, to redirect electromagnetic radiation, and to absorb electromagnetic radiation, thus increasing the QE of the device. The textured region can include surface features to increase the effective absorption length of the silicon material. The surface features can be cones, pyramids, pillars, protrusions, microlenses, quantum dots, inverted features and the like. Factors such as manipulating the feature sizes, dimensions, material type, dopant profiles, texture location, etc. can allow the diffusing region to be tunable for a specific wavelength. In one aspect, tuning the device can allow specific wavelengths or ranges of wavelengths to be absorbed. In another aspect, tuning the device can allow specific wavelengths or ranges of wavelengths to be reduced or eliminated via filtering.

As has been described, a textured region according to aspects of the present disclosure can allow a silicon material to experience multiple passes of incident electromagnetic radiation within the device, particularly at longer wavelengths (i.e. infrared). Such internal reflection increases the effective absorption length to be greater than the thickness of the semiconductor substrate. This increase in absorption length increases the quantum efficiency of the device, leading to an improved signal to noise ratio. The textured region can be associated with the surface nearest the impinging electromagnetic radiation, or the textured region can be associated with a surface opposite in relation to impinging electromagnetic radiation, thereby allowing the radiation to pass through the silicon material before it hits the textured region. Additionally, the textured region can be doped. In one aspect, the textured region can be doped to the same or similar doping polarity as the silicon substrate so as to provide a doped contact region on the backside of the device.

The textured region can be formed by various techniques, including lasing, chemical etching (e.g. anisotropic etching, isotropic etching), nanoimprinting, additional material deposition, reactive ion etching, and the like. One effective method of producing a textured region is through laser processing. Such laser processing allows discrete locations of the semiconductor substrate to be textured. A variety of techniques of laser processing to form a textured region are contemplated, and any technique capable of forming such a region should be considered to be within the present scope. Laser treatment or processing can allow, among other things, enhanced absorption properties and thus increased electromagnetic radiation focusing and detection.

In one aspect, for example, a target region of the silicon material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a silicon material is irradiated with laser radiation to form a textured or surface modified region. Such laser processing can occur with or without a dopant material. In those aspects whereby a dopant is used, the laser can be directed through a dopant carrier and onto the silicon surface. In this way, dopant from the dopant carrier is introduced into the target region of the silicon material. Such a region incorporated into a silicon material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of the silicon material includes exposing the laser radiation to a dopant such that irradiation incorporates the dopant into the semiconductor. Various dopant materials are known in the art, and are discussed in more detail herein. It is also understood that in some aspects such laser processing can occur in an environment that does not substantially dope the silicon material (e.g. an argon atmosphere).

Thus the surface of the silicon material that forms the textured region is chemically and/or structurally altered by the laser treatment, which may, in some aspects, result in the formation of surface features appearing as nanostructures, microstructures, and/or patterned areas on the surface and, if a dopant is used, the incorporation of such dopants into the semiconductor material. In some aspects, such features can be on the order of 50 nm to 20 µm in size and can assist in the absorption of electromagnetic radiation. In other words, the textured surface can increase the probability of incident radiation being absorbed by the silicon material.

The type of laser radiation used to surface modify a silicon material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse width, pulse fluence, pulse frequency, polarization, laser propagation direction relative to the silicon material, etc. In one aspect, a laser can be configured to provide pulsatile lasing of a silicon material. A short-pulsed laser is one capable of producing femtosecond, picosecond and/or nanosecond pulse durations. Laser pulses can have a central wavelength in a range of about from about 10 nm to about 12 µm, and more specifically from about 200 nm to about 1600 nm. The pulse width of the laser radiation can be in a range of from about tens of femtoseconds to about hundreds of nanoseconds. In one aspect, laser pulse widths can be in the range of from about 50 femtoseconds to about 50 picoseconds. In another aspect, laser pulse widths can be in the range of from about 50 picoseconds to 100 nanoseconds. In another aspect, laser pulse widths are in the range of from about 50 to 500 femtoseconds.

The number of laser pulses irradiating a target region can be in a range of from about 1 to about 5000. In one aspect, the number of laser pulses irradiating a target region can be from about 2 to about 1000. Further, the repetition rate or frequency of the pulses can be selected to be in a range of from about 10 Hz to about 10 MHz, or in a range of from about 1 kHz to about 1 MHz, or in a range from about 10 Hz to about 10 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

A variety of dopants are contemplated, and any such material that can be used in doping the first doped region, the second doped region, the textured region, or any other doped portion of the optoelectronic device is considered to be within the present scope. It should be noted that the particular dopant utilized can vary depending on the silicon material being laser treated, as well as the intended uses of the resulting silicon material.

A dopant can be either electron donating or hole donating. In one aspect, non-limiting examples of dopants can include S, F, B, P, N, As, Se, Te, Ge, Ar, Ga, In, Sb, and combinations thereof. It should be noted that the scope of dopants should include, not only the dopants themselves, but also materials in forms that deliver such dopants (i.e. dopant carriers). For example, S dopants includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5\times10^{14}$ and about $1\times10^{16}$ ions/cm$^2$. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^{-4}$ mol/cm$^3$. $SF_6$ gas is a good carrier for the incorporation of sulfur into the semiconductor material via a laser process without significant adverse effects on the silicon material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

Accordingly, the first doped region and the second doped region can be doped with an electron donating or hole donating species to cause the regions to become more positive or negative in polarity as compared to each other and/or the silicon substrate. In one aspect, for example, either doped region can be p-doped. In another aspect, either doped region can be n-doped. In one aspect, for example, the first doped region can be negative in polarity and the second doped region can be positive in polarity by doping with p+ and n− dopants. In some aspects, variations of n(−−), n(−), n(+), n(++), p(−−), p(−), p(+), or p(++) type doping of the regions can be used. Additionally, in some aspects the silicon material can be doped in addition to the first and second doped regions. The silicon material can be doped to have a doping polarity that is different from one or more of the first and second doped regions, of the silicon material can be doped to have a doping polarity that is the same as one or more of the first and second doped regions. In one specific aspect, the silicon material can be doped to be p-type and one or more of the first and second doped regions can be n-type. In another specific aspect, the silicon material can be doped to be n-type and one or more of the first and second doped regions can be p-type. In one aspect, at least one of the first or second doped regions has a surface area of from about 0.1 μm$^2$ to about 32 μm$^2$.

In another aspect, at least a portion of the textured region and/or the silicon material can be doped with a dopant to generate a back surface field. A back surface field can function to repel generated charge carriers from the backside of the device and toward the junction to improve collection efficiency and speed. The addition of a back surface field can increase charge carrier collection and depletion. The presence of a back surface field also acts to suppress dark current contribution from the surface of a device.

Figure 3:
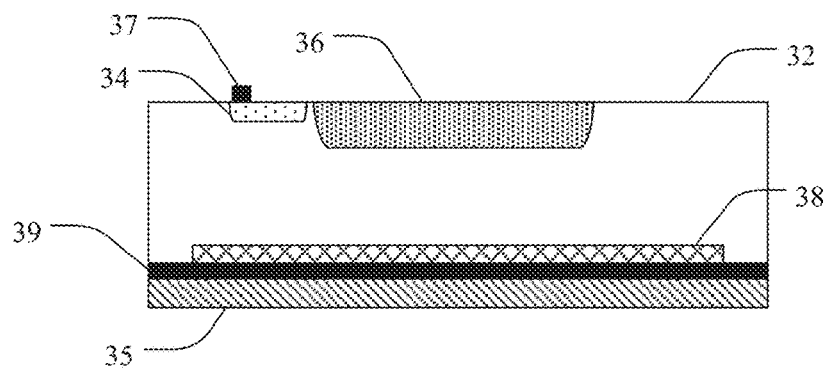
FIG. 3 is a schematic view of a photosensitive device in accordance with yet another aspect of the present disclosure.

In another aspect, as is shown in FIG. 3, an optoelectronic device can include a silicon material 32 having a first doped region 34 and a second doped region 36 associated therewith, where the first and second doped regions form a semiconductive photodiode junction. A textured region 38 is coupled to the silicon material, and is positioned to interact with electromagnetic radiation. The optoelectronic device can also include a first contact 37 to provide electrical contact to one side of the device, and a second contact 39 to provide electrical contact with the other side of the device. In one aspect, the first contact and the second contact are opposite in voltage polarity from one another. Note that in some aspects, the first and second contacts can be on the same side of the device (not shown). Additionally, a support substrate 35 can be coupled to the device in order to provide structural stability thereto. In one aspect, the one of the contacts can be a doped portion of the textured region. Either a portion of the textured region or the entire textured region can be doped to create one of the contacts.

While the optoelectronic devices according to aspects of the present disclosure can operate in the absence of a bias at high speeds, in one aspect a reverse bias is applied across the first and second contacts. Such a reverse bias can function to decrease the response time of the device by more quickly sweeping charge carriers from the silicon material. Accordingly, for those situations whereby a bias is used, any bias voltage capable of sweeping charge carriers from the silicon material is considered to be within the present scope. In one aspect, for example, the reverse bias is from about 0.001 V to about 20 V. In another aspect, the reverse bias is from about 0.001 V to about 10 V. In yet another aspect, the reverse bias is from about 0.001 V to about 5 V. In a further aspect, the reverse bias is from about 0.001 V to about 3 V. In yet a further aspect, the reverse bias is from about 3 V to about 5 V. In some aspects, the reverse bias can be absent, or in other words, 0 V is applied across the first and second contacts. In such cases, the charge carriers can be depleted from the silicon material by the junction potential created by the first and second doped regions.

Figure 4:
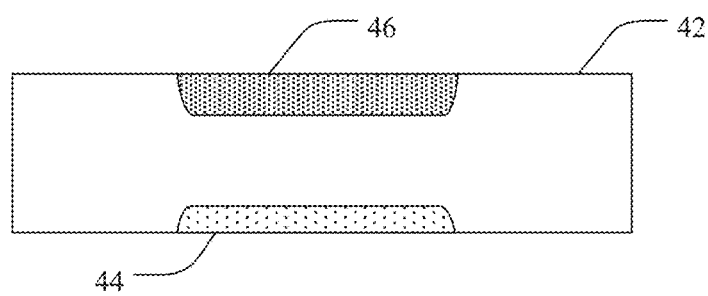
FIG. 4 is a schematic view of a photosensitive device in accordance with a further aspect of the present disclosure.
Figure 5:
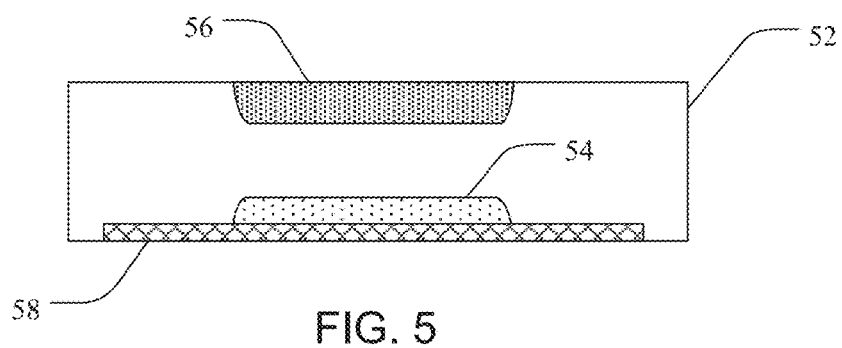
FIG. 5 is a schematic view of a photosensitive device in accordance with yet a further aspect of the present disclosure.

In some aspects, the first and second doped regions can be on opposite sides of the silicon material. As is shown in FIG. 4, for example, a silicon material 42 can include a first doped region 44 associated with one surface of the silicon material and a second doped region 46 associated with the opposite side of the silicon material. Furthermore, the textured region can be associated with either doped region. As is shown in FIG. 5, for example, a silicon material 52 can include a first doped region 54 associated with one surface of the silicon material and a second doped region 56 associated with the opposite side of the silicon material, where a textured region 58 is associated with the first doped region. In another aspect, the textured region is associated with the second doped region (not shown). In a further aspect, a textured region can be associated with each doped region (not shown).

Figure 6:
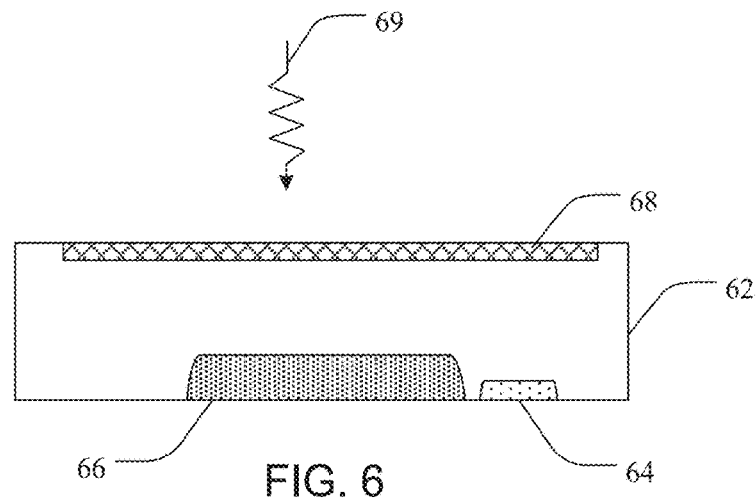
FIG. 6 is a schematic view of a photosensitive device in accordance with another aspect of the present disclosure.
Figure 7:
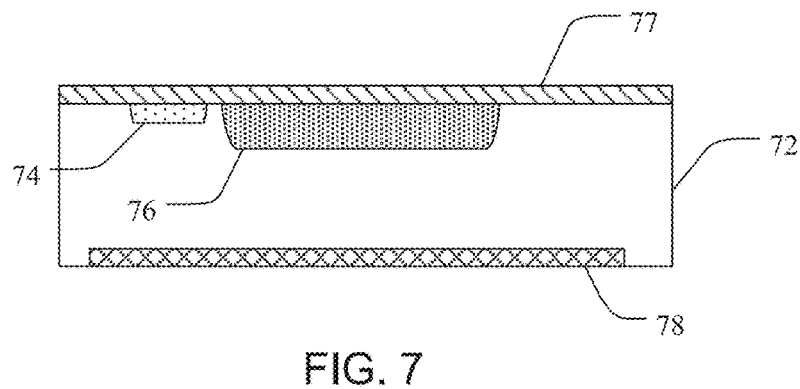
FIG. 7 is a schematic view of a photosensitive device in accordance with yet another aspect of the present disclosure.

In another aspect, as is shown in FIG. 6, a silicon material 62 can have a first doped region 64 and a second dope region 66 on one surface, and a textured region 68 on an opposing surface. In this case, electromagnetic radiation 69 is incident on the side of the silicon material having the textured surface. In another aspect, as is shown in FIG. 7, a silicon material 72 can have a first doped region 74 and a second doped region 76 on an opposing surface to a textured region 78. An antireflective layer 77 can be coupled to the silicon material on the opposite surface to the textured layer. In some aspects, the antireflective layer can be on the same side of the silicon material as the textured region (not shown). Furthermore, in some aspects a lens can be optically coupled to the silicon material and positioned to focus incident electromagnetic radiation into the silicon material.

In another aspect of the present disclosure, a photodiode array is provided. Such an array can include a silicon material having an incident light surface, at least two photodiodes in the silicon material, where each photodiode includes a first doped region and a second doped region forming a junction, and a textured region coupled to the silicon material and positioned to interact with electromagnetic radiation. The textured region can be a single textured region or multiple textured regions. Additionally, the photodiode array has a response time of from about 1 picosecond to about 5 nanoseconds and a responsivity of greater than or equal to about 0.4 A/W for electromagnetic radiation having at least one wavelength from about 800 nm to about 1200 nm.

Figure 8:
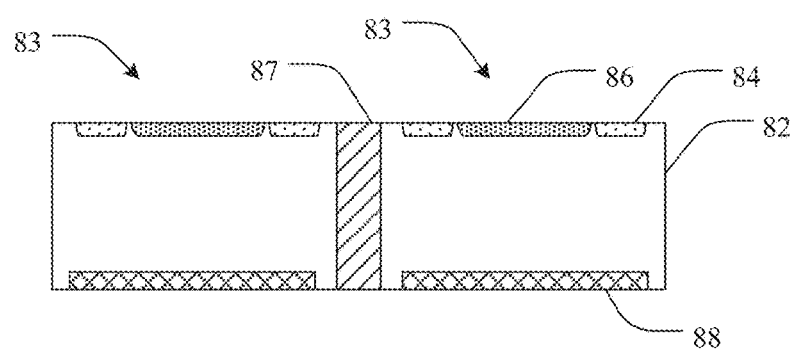
FIG. 8 is a schematic view of a photosensitive array device in accordance with a further aspect of the present disclosure.

As is shown in FIG. 8, for example, a silicon material 88 can include at least two photodiodes 83 each having a first doped region 84 and a second doped region 86. A textured region 88 is positioned to interact with electromagnetic radiation. FIG. 8 shows a separate textured region for each photodiode. In some aspects, a single textured region can be used to increase the absorption path lengths of multiple photodiodes in the array. Furthermore, an isolation structure 57 can be positioned between the photodiodes to electrically and/or optically isolate the photodiodes from one another. In another aspect, the photodiode array can be electronically coupled to electronic circuitry to process the signals generated by each photodiode.

Various types of isolation structures are contemplated, and any such isolation is considered to be within the present scope. The isolation structure can be shallow or deep trench isolation. Furthermore, the isolation structure can include depths between traditional shallow and deep isolation, depending on the device design. Isolation structures can include dielectric materials, reflective materials, conductive materials, and combinations thereof, including textured regions and other light diffusing features. Thus the isolation structure can be configured to reflect incident electromagnetic radiation, in some cases until it is absorbed, thereby increasing the effective absorption length of the device.

Photodiode arrays can have a variety of uses. For example, in one aspect such an array can be an imager. Numerous types of imagers are contemplated, and any such imager or imaging application is considered to be within the present scope. Non-limiting examples include 3D imaging, machine vision, night vision, security and surveillance, various commercial applications, laser range finding and marking, and the like. Thus, in the case of 3D imaging for example, the array is operable to detect a phase delay between a reflected and an emitted optical signal.

As one example, various applications can benefit from depth information, such as hands-free gesture control, video games, medical applications, machine vision, etc. Time-of-flight (TOF) is a technique developed for use in radar and LIDAR (Light Detection and Ranging) systems to provide depth information. The basic principle of TOF involves sending a signal and measuring a property of the returned signal from a target. The measured property is used to determine the TOF. Distance to the target is therefore derived by multiplication of half the TOF and the velocity of the signal.

Figure 9:
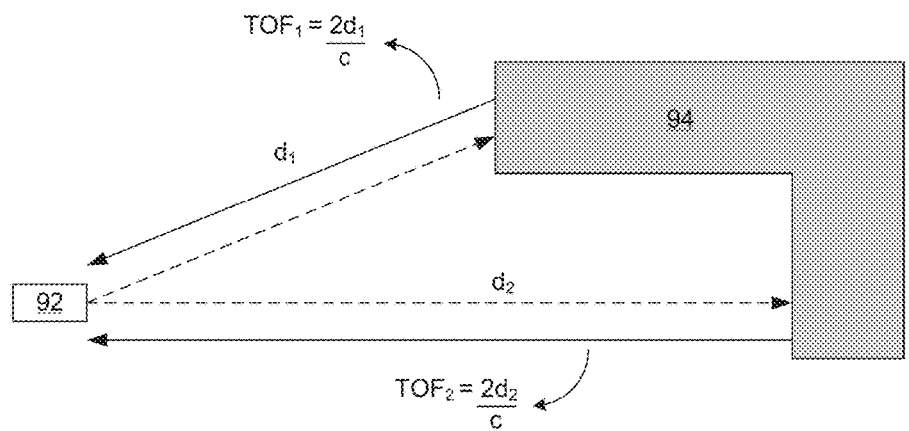
FIG. 9 is an illustration of a time of flight measurement in accordance with another aspect of the present disclosure.

FIG. 9 illustrates a time of flight measurement with a target having multiple surfaces that are separated spatially. Equation (III) can be used to measure the distance to a target where d is the distance to the target and c is the speed of light.

$$d = \frac{TOF * c}{2} \quad \text{(III)}$$

By measuring the time (e.g. TOF) it takes for light to be emitted from a light source 92, travel to and from a target 94, the distance between the light source (e.g. a light emitting diode (LED)) and the surface of the target can be derived. For an imager, if each pixel can perform the above TOF measurement, a 3D image of the target can be achieved. The distance measurements become difficult with TOF methods when the target is relatively near the source due to the high speed of light. In one aspect, therefore, a TOF measurement can utilize a modulated LED light pulse and measure the phase delay between emitted light and received light. Based on the phase delay and the LED pulse width, the TOF can be derived.

TOF concept has been utilized in both CMOS and CCD sensor to obtain depth information from each pixel. In many traditional 3D TOF sensors, an infrared LED or laser emits a modulated light pulse to illuminate a target. The measured phase shift between emitted and received light can be used to derive the depth information. Such methods, however, can have various problematic issues. For example, ambiguity (e.g. aliasing) occurs if the TOF difference between two targets is equal to half period of light source modulation frequency. To solve the ambiguity issue, an often used approach is to measure the same scene with multiple modulation frequencies. In addition, due to the use of near infrared LED or laser, a good color image normally cannot be achieved by the same 3D TOF sensor since an infrared (IR) cut filter cannot be used. Further, many current 3D TOF sensors operate in a rolling shutter mode. In rolling shutter mode an image is captured by scanning across the frame either vertically or horizontally. Motion artifacts are known to accompany cameras that use the rolling shutter mode and can severely degrade the quality of the depth map. Another issue occurs when ambient light creates an un-wanted offset in the signal output. The photon-shot noise related to the signal offset will degrade the signal-to-noise (SNR) ratio of the useful signal related to modulated near infrared (NIR) light emitting diode (LED). Therefore, many current 3D TOF imagers cannot operate outdoors (e.g. bright ambient light). In addition to the ambient light, any dark current will also contribute to the un-wanted offset, which is same as normal visible pixel.

Figure 10A:
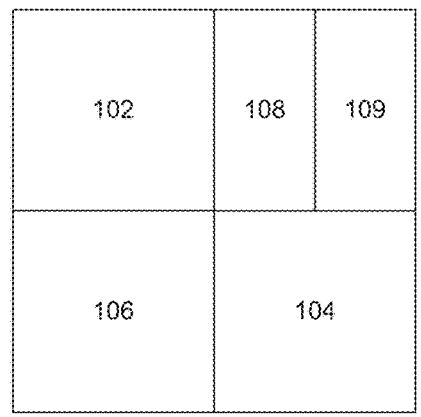
FIG. 10a is a schematic view of a pixel configuration for a photoimager array in accordance with another aspect of the present disclosure.
Figure 10B:
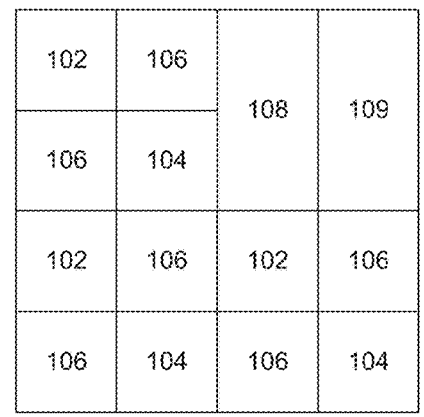
FIG. 10b is a schematic view of a pixel configuration for a photoimager array in accordance with another aspect of the present disclosure.
Figures 10C, 11:
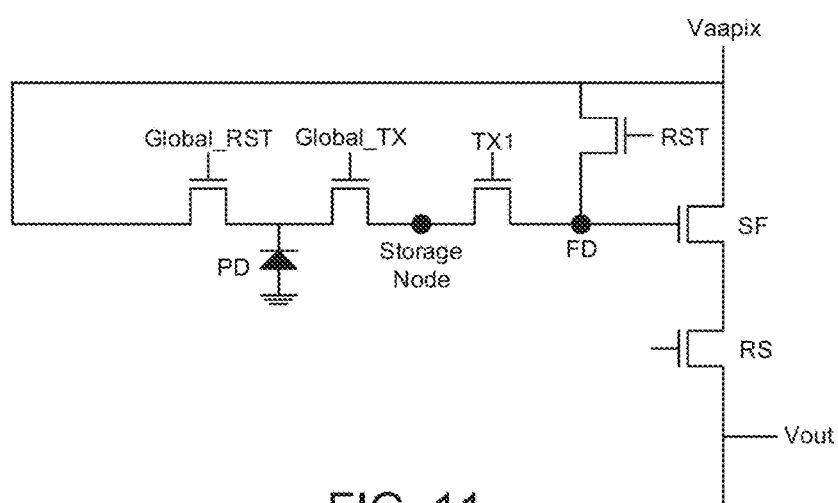
FIG. 10c is a schematic view of a pixel configuration for a photoimager array in accordance with another aspect of the present disclosure.
FIG. 11 is a schematic diagram of a six transistor imager in accordance with another aspect of the present disclosure.

As one example, a 3D pixel, such as a TOF 3D pixel with enhanced infrared response can improve depth accuracy. In one aspect, a photoimager array can include at least one 3D infrared detecting pixel and at least one visible light detecting pixel arranged monolithically in relation to each other. FIGS. 10a-c show non-limiting example configurations of pixel arrangements of such arrays. FIG. 10a shows one example of a pixel array arrangement having a red pixel 102, a blue pixel 104, and a green pixel 106. Additionally, two 3D TOF pixels (108 and 109) having enhanced responsivity or detectability in the infrared regions of the light spectrum are included. The combination of two 3D pixels allows for better depth perception. In FIG. 10b, the pixel arrangement shown includes an imager as described in FIG. 10a and three arrays of a red pixel, a blue pixel, and two green pixels. Essentially, one TOF pixel (108 and 109) replaces one quadrant of a RGGB pixel design. In this configuration, the addition of several green pixels allows for the capture of more green wavelengths that is needed for green color sensitivity need for the human eye, while at the same time capturing the infrared light for depth perception. It should be noted that the present scope should not be limited by the number or arrangements of pixel arrays, and that any number and/or arrangement is included in the present scope. FIG. 10c shows another arrangement of pixels according to yet another aspect.

Various imager configurations and components are contemplated, and any such should be considered to be within the present scope. Non-limiting examples of such components can include a carrier wafer, an antireflective layer, a dielectric layer, circuitry layer, a via(s), a transfer gate, an infrared filter, a color filter array (CFA), an infrared cut filter, an isolation feature, and the like. Additionally, such devices can have light absorbing properties and elements as has been disclosed in U.S. patent application Ser. No. 12/885,158, filed on Sep. 17, 2010 which is incorporated by reference in its entirety.

As has been described, a TOF pixel can have an on-pixel optical narrow band pass filter. The narrow band pass filter design can match the modulated light source (either LED or laser) emission spectrum and may significantly reduce unwanted ambient light that can further increase the signal to noise ratio of modulated infrared light. Another benefit of increased infrared QE is the possibility of high frame rate operation for high speed 3D image capture. An integrated infrared cut filter can allow a high quality visible image with high fidelity color rendering. Integrating an infrared cut filter onto the sensor chip can also reduce the total system cost of a camera module (due to the removal of typical IR filter glass) and reduce module profile (good for mobile applications).

The thickness and responsivity of a QE enhanced imager can have significant impact on a TOF pixel operation, due to the increased speed and detection. The increased QE will contribute to higher image signal to noise, which will greatly reduce depth error. Further, increased QE on a silicon material having a thickness of less than about 100 µm can allow the pixel to reduce the diffusion component of signal so that the charge collection and transfer speed can be increased, which is good for TOF pixel operation. In general, the photo-generated carrier created inside pixel will depend on two mechanisms for collection: drift and diffusion. For light having shorter wavelengths, most of the charge carriers will be generated in a shallow region of the device and within the depletion region of the diode. Those carriers can be collected relatively fast, via drift. For infrared light, the majority of photo carriers are be generated deeper inside the silicon material. To achieve higher QE, normally thick silicon layers are used. As such, most of the charge carriers carrier will be generated outside the diode's depletion region and will depend on diffusion to be collected. For a 3D TOF pixel, however, a fast sampling of photo generated charge is beneficial.

For the devices according to aspects of the present disclosure, a high QE can be achieved within a thin (i.e. less than 100 µm) layer of silicon material. Therefore, substantially all of the carriers generated can be collected via drift mechanism. This allows a fast charge collection and transfer.

FIG. 11 shows an exemplary schematic for a six-transistor (6-T) architecture which will allow global shutter operation according to one aspect of the present disclosure. The pixel can include a photodiode (PD), a global reset (Global_RST), a global transfer gate (Global_TX), a storage node, a transfer gate (TX1), reset (RST), source follower (SF), floating diffusion (FD), row select transistor (RS), power supply (Vaapix) and voltage out (Vout). Due to the use of extra transfer gate and storage node, correlated-double-sampling (CDS) is allowed. Therefore, the read noise should be able to match typical CMOS 4T pixels.

Figure 12:
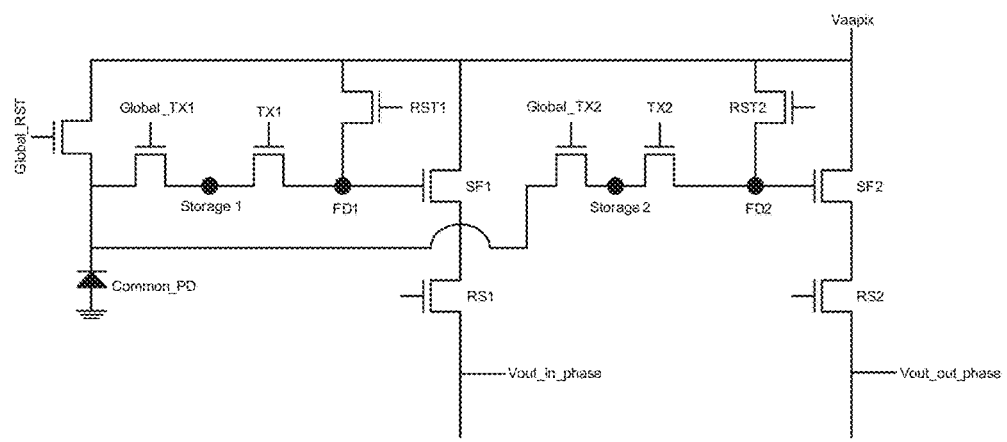
FIG. 12 is a schematic diagram of an eleven transistor imager in accordance with another aspect of the present disclosure.

FIG. 12 shows an exemplary schematic of a 3D TOF pixel according to one aspect of the present disclosure. The 3D TOF pixel can have 11 transistors for accomplishing the depth measurement of the target. In this embodiment the 3D pixel can comprise a photodiode (PD), a global reset (Global_RST), a first global transfer gate (Global_TX1), a first storage node, a first transfer gate (TX1), a first reset (RST1), a first source follower (SF1), a first floating diffusion (FD1), a first row select transistor (RS1), a second global transfer gate (Global_TX2), a second storage node, a second transfer gate (TX2), a second reset (RST2), a second source follower (SF2), a second floating diffusion (FD2), a second row select transistor (RS2), power supply (Vaapix) and voltage out (Vout). Other transistors can be included in the 3D architecture and should be considered within the scope of the present invention. The specific embodiment with 11 transistors can reduce motion artifacts due to the global shutter operation, thereby giving more accurate measurements.

As has been described, a photodiode array can be used in various communication applications. For example, the array can be used to detect pulsed optical signals. Such pulsed signals can be used to carry data at high speeds. By utilizing photodiodes having fast response times, very short pulse widths can be detected, thus increasing the speed of data communication. In one aspect, for example, the pulsed optical signals can have pulse widths from about 1 femtosecond to about 1 microsecond. In another aspect, the at least two photodiodes are operable to transmit data at a rate of at least 1 Gbps. In yet another aspect, the at least two photodiodes are operable to transmit data at a rate of at least 2 Gbps.

Figure 13:
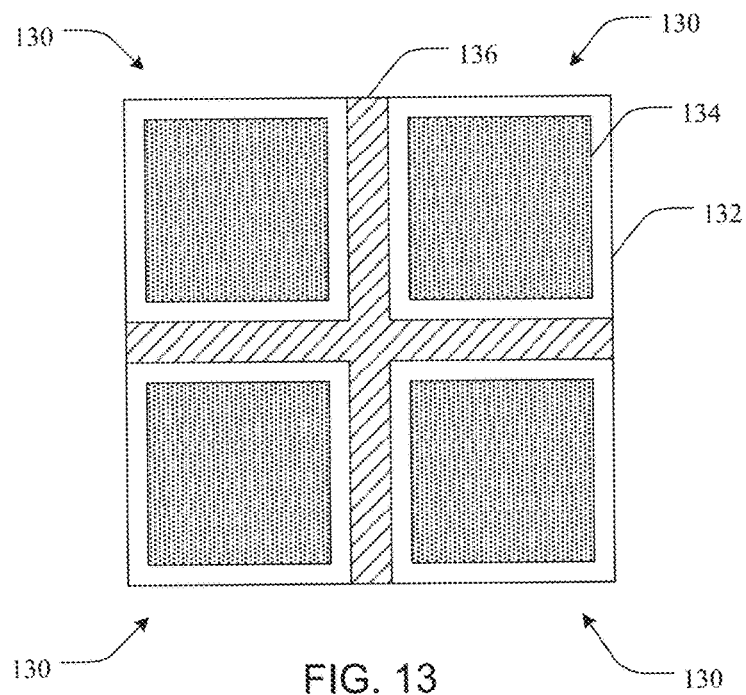
FIG. 13 is a schematic view of a photosensitive array device in accordance with yet a further aspect of the present disclosure.
Figure 14:
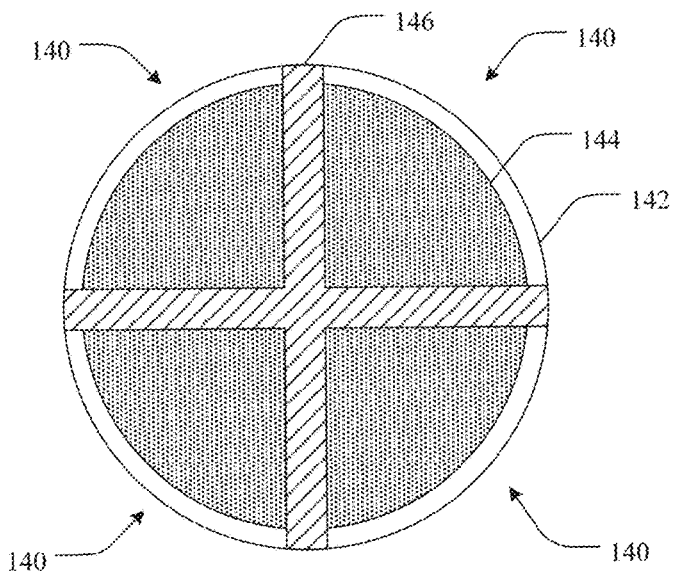
FIG. 14 is a schematic view of a photosensitive array device in accordance with another aspect of the present disclosure.

In one aspect, an array of four photodiodes forming a quad photodiode array (quad array) is provided. A quad array can be used in a variety of applications, including communications, laser range finding, laser alignment, and the like. In some aspects, the four photodiodes can have uniform photo response, or in other words, are selective to the same wavelength range. It can also be beneficial to have little to no electrical and/or optical cross talk between the photodiodes in the quad array. For this reason, isolation structures can be disposed between the photodiodes can be beneficial. Some application can also benefit from the high speed operation of the photodiodes according to aspects of the present disclosure. FIGS. 13 and 14 show exemplary configurations of quad arrays. FIG. 13 shows a quad array of four photodiodes 130 including a silicon material 132 and a doped region 134. The doped region is made up of multiple doped regions forming a junction. An isolation structure 136 is located between the photodiodes to electrically and/or optically isolate the photodiodes against undesirable cross talk. FIG. 14 shows a similar arrangement in a circular configuration. This array includes four photodiodes 140 including a silicon material 142, a doped region 144, and an isolation structure 146. In addition to those materials discussed herein, the isolation structure can include a dielectric material for electrical isolation and a metal material for a high reflectivity to the light incidence on the walls of the trench. In one aspect, the sides and surfaces of the diode between the isolation regions can be more heavily doped than the silicon material in order to pin the Fermi level at the band edge and reduce the dark current. The photodiode can also include a buried layer of opposite conductivity type to the silicon material. In some aspects, the doping of the silicon material can be kept low and the thickness can be thinned to provide a fast response time to the optical signal. A textured region can function to backside scatter light that passes through the silicon material, thus improving near infrared responsivity.

Figure 15:
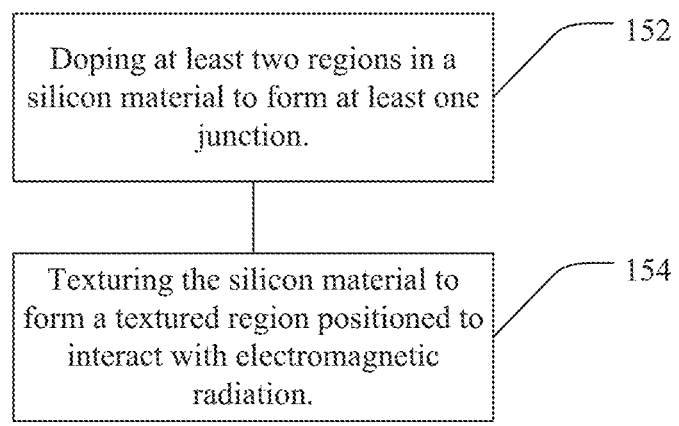
FIG. 15 is a depiction of a method of increasing the speed of an optoelectronic device in accordance with yet another aspect of the present disclosure.

In yet another aspect, a method of increasing the speed of an optoelectronic device is provided. As is shown in FIG. 15, such a method can include doping at least two regions in a silicon material to form at least one junction 152 and texturing the silicon material to form a textured region positioned to interact with electromagnetic radiation 154. The optoelectronic device has a response time of from about 1 picosecond to about 5 nanoseconds and a responsivity of greater than or equal to about 0.4 A/W for electromagnetic radiation having at least one wavelength from about 800 nm to about 1200 nm.

Of course, it is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements. Thus, while the present invention has been described above with particularity and detail in connection with what is presently deemed to be the most practical and preferred embodiments of the invention, it will be apparent to those of ordinary skill in the art that numerous modifications, including, but not limited to, variations in size, materials, shape, form, to function and manner of operation, assembly and use may be made without departing from the principles and concepts set forth herein.

What is claimed is:

1. A method for configuring an optoelectronic device for light detection and ranging, the method comprising:
    doping at least two regions in a silicon optoelectronic device material to form at least one depletion region, wherein the silicon optoelectronic device material exhibits a thickness in a range of about 1 micron to about 100 microns and comprises a surface for receiving incident radiation;
    providing an infrared optical band pass filter for reducing unwanted ambient light; and
    texturing the silicon material to form a textured region positioned to interact with electromagnetic radiation so as to increase the quantum efficiency of the optoelectronic device,
    wherein the optoelectronic device has a response time of from about 1 picosecond to about 5 nanoseconds and a quantum efficiency of greater than or equal to about 40% for electromagnetic radiation having a wavelength of about 940 nm.

2. A system for performing light detection and ranging, comprising:
    a silicon optoelectronic device material exhibiting a thickness in a range of about 1 micron to about 100 microns and having a surface for receiving incident radiation;
    a first doped region and a second doped region forming at least one depletion region in the silicon material;
    an infrared optical bandpass filter for reducing unwanted ambient light; and
    a textured region coupled to the silicon material and positioned to interact with electromagnetic radiation so as to increase the quantum efficiency of the optoelectronic device,
    wherein the optoelectronic device has a response time of from about 1 picosecond to about 5 nanoseconds and a quantum efficiency of greater than or equal to about 40% for electromagnetic radiation having a wavelength of about 940 nm.

3. The system of claim 2, wherein the silicon optoelectronic device material exhibits a thickness in a range of about 1 micron to about 10 microns.

4. The system of claim 2, wherein the silicon optoelectronic device material exhibits a thickness in a range of about 1 micron to about 5 microns.

5. The system of claim 2, wherein the textured region is formed via one of lasing, chemical etching, nanoimprinting, and reactive ion etching.

6. The system of claim 2, wherein the textured region is associated with the surface of the silicon material nearest the impinging electromagnetic radiation.

7. The system of claim 2, wherein the silicon optoelectronic device material comprises an array of photodetectors.

8. The system of claim 7, further comprising an isolation structure disposed between each of the photodectectors.

9. The system of claim 8, wherein the isolation structure comprises one of dielectric materials, reflective materials, conductive materials, and combinations thereof.

10. The system of claim 2, wherein the array is operable to detect a phase delay between a reflected and an emitted optical signal.

11. The system of claim 10, further comprising a light source configured to emit an optical signal.

12. The system of claim 11, wherein the light source is configure to emit electromagnetic radiation at a wavelength of about 940 nm.

* * * * *